United States Patent
Dent

(10) Patent No.: US 10,211,640 B2
(45) Date of Patent: Feb. 19, 2019

(54) ADAPTIVE LOAD SHARING SYSTEM

(71) Applicant: Koolbridge Solar, Inc., Wrightsville Beach, NC (US)

(72) Inventor: Paul Wilkinson Dent, Pittsboro, NC (US)

(73) Assignee: KOOLBRIDGE SOLAR, INC., Wrightsville Beach, NC (US)

( * ) Notice: Subject to any disclaimer, the term of this patent is extended or adjusted under 35 U.S.C. 154(b) by 218 days.

(21) Appl. No.: 15/209,958

(22) Filed: Jul. 14, 2016

(65) Prior Publication Data

US 2018/0019593 A1    Jan. 18, 2018

(51) Int. Cl.
| | | |
|---|---|---|
| H02J 1/00 | (2006.01) |
| H02J 3/38 | (2006.01) |
| H02M 7/44 | (2006.01) |
| H02M 7/00 | (2006.01) |
| H02J 3/46 | (2006.01) |
| H02J 9/06 | (2006.01) |
| H02J 7/35 | (2006.01) |

(52) U.S. Cl.
CPC .............. *H02J 3/383* (2013.01); *H02J 3/46* (2013.01); *H02J 9/062* (2013.01); *H02M 7/00* (2013.01); *H02M 7/44* (2013.01); *H02J 7/35* (2013.01); *H02J 2009/067* (2013.01); *H02J 2009/068* (2013.01)

(58) Field of Classification Search
CPC ...................................................... H02J 3/383
See application file for complete search history.

(56) References Cited

U.S. PATENT DOCUMENTS

| | | |
|---|---|---|
| 4,213,173 A | 7/1980 | Link et al. |
| 6,459,171 B1 * | 10/2002 | Leifer ............... H02J 1/10 307/24 |
| 8,415,937 B2 | 4/2013 | Hester |
| 8,937,822 B2 | 1/2015 | Dent |
| 9,190,836 B2 | 11/2015 | Dent |
| 2008/0136387 A1 | 6/2008 | Bertele |
| 2009/0108820 A1 | 4/2009 | Mirea |
| 2010/0052638 A1 | 3/2010 | Lesso et al. |
| 2011/0089843 A1 | 4/2011 | Krapp et al. |
| 2011/0089915 A1 | 4/2011 | Qiu et al. |

(Continued)

FOREIGN PATENT DOCUMENTS

| | | |
|---|---|---|
| CN | 203840206 U | 7/2014 |
| DE | 2728377 A1 | 1/1979 |

(Continued)

OTHER PUBLICATIONS

Trace Engineering—"Multiwire Branch Circuit Wiring Precautions When Using Stand-Alone 120 VAC Inverters or Generators", Jul. 23, 2008.

(Continued)

*Primary Examiner* — Daniel Puentes
(74) *Attorney, Agent, or Firm* — Coats & Bennett, PLLC

(57) ABSTRACT

Sharing of load current in desired ratios between multiple electrical voltage sources is achieved without coupling between the sources by controlling a selection switch to select each voltage source for a proportion of the time at a high rate, the switching rate components being prevented from being seen by either the load or the sources through use of low-pass filters.

14 Claims, 16 Drawing Sheets

(56) References Cited

U.S. PATENT DOCUMENTS

| | | |
|---|---|---|
| 2013/0127548 A1 | 5/2013 | Popplewell et al. |
| 2013/0278235 A1 | 10/2013 | Divan et al. |
| 2014/0049117 A1 | 2/2014 | Rahman |
| 2014/0333277 A1 | 11/2014 | Ngo et al. |
| 2015/0311795 A1 | 10/2015 | Yang et al. |
| 2016/0036223 A1 | 2/2016 | Mishra et al. |
| 2016/0372927 A1 | 12/2016 | Dent |

FOREIGN PATENT DOCUMENTS

| | | |
|---|---|---|
| FR | 2673010 A1 | 8/1992 |
| GB | 1261838 A | 1/1972 |
| WO | 2015026343 A1 | 2/2015 |

OTHER PUBLICATIONS

Samlex America—"20 I 240 VAC Single Split Phase & Multi-Wire Branch Circuits Excerpt from G4 InverCharge Series Manual", Jun. 25, 2012.

\* cited by examiner

ADAPTIVE LOAD SHARING SYSTEM

BACKGROUND

The present invention relates to load sharing between two electric energy sources, such as a DC to AC inverter on the one hand and the utility grid on the other hand, and in particular, such as a DC to AC converter deriving its DC energy input from solar panels or a solar-charged battery In the prior art, two types of DC to AC converters for use in solar energy installations are known.

One type of inverter, called a grid-tie inverter, converts DC energy to an AC current and feeds the current back into the electricity grid to reduce net energy consumption. Such an inverter is said to operate in "current mode" as the voltage is defined by the utility grid to which it is connected, and it is controlled to output a current at that voltage, the product of which is the desired power level to be transferred from the DC source to the grid.

The big disadvantage of this method is that, if the utility is in an outage, the system must be switched off. Another disadvantage is that, as the penetration of solar energy increases, there will come a point where the grid cannot accept all the aggregated power that solar systems are attempting to feed back into it on a sunny day. Other disadvantages include political issues such as the requirement for connection permission from the utility, permitting from local or State authorities, utility subversion of solar via unattractive billing regimes and barriers to innovation such as the National Electrical Code and Listing requirements.

A second type of inverter, called a standalone inverter, converts DC power to an AC voltage equivalent to the grid voltage which can be used to power loads directly, thereby avoiding consuming power from the grid. Energy storage, i.e. a battery, is required for standalone systems to smooth out the difference between supply and demand as clouds move over the sun uncorrelated with appliance loads being switched on and off.

U.S. Pat. No. 8,937,822 to Applicant Dent, entitled "Solar Energy Conversion and Utilization System", discloses both grid-tie and standalone DC to AC inverters, and discloses an adaptively controlled distribution panel that selects which breaker circuits to power from a standalone inverter and which to power from the electric utility grid, thereby assisting in dynamically matching supply and demand.

When it is attempted to utilize a standalone inverter to power a home in a totally off-grid installation, a very large and expensive battery is required to ensure the ability to bridge a period of overcast weather. However, the above '822 patent discloses a system that uses both grid and solar power and adaptively transfers load between utility and solar in such a way that the net solar power used in place of utility power matches the average solar power received over a shorter period of time, thus allowing the battery size and cost to be drastically reduced.

Another method of using a current-mode inverter that is known in the prior art is called "utility assist mode". This is substantially the same as grid-tie mode, except that the inverter current is controlled to supplement current coming from the grid without ever feeding power back to the grid. The current is thus controlled to be less or equal to the current consumed from the grid by active appliances. The advantage of this method is that a finer degree of matching between solar power generated and solar power used can be achieved. However, since the inverter is still in parallel with the grid, it must switch off if the grid is in outage, unless a fast disconnect switch operates and simultaneously switches to voltage-mode DC to AC inversion. For the latter, a battery will also be required for energy smoothing. It is also not clear that connection permission is not required, as the inverter current waveform is being impressed on the grid and must meet utility specifications and all of the requirements of specification UL1741. There is therefore a need for an alternative method of ensuring the use of just as much solar power as is momentarily available while avoiding ever connecting the inverter to the grid. The requirement may be summarized in general as a method and apparatus for continuously sharing load between two energy sources without a direct electrical connection between the two energy sources.

SUMMARY

A first AC electrical voltage source such as the electric utility grid is connected through a first low-pass filter to a first input of an electronic two-way AC selection switch. A second AC electrical voltage source such as a solar-energy-driven DC to AC inverter is connected through a second low-pass filter to a second input of the two-way AC selection switch. The second AC voltage source is roughly synchronized in phase and voltage with the first voltage source. The selection switch is controlled by a controller to select one of the first or second voltage sources to be output from the switch output terminal. The switch output terminal is connected to one or more electrical loads through one or more optional third low pass filters. The switch controller operates the switch to select between the first and second voltage sources alternately with a controlled mark-space ratio and at a frequency higher than the-cutoff frequency of the low-pass filters such that the mean currents drawn respectively from the first and second voltage sources are sinusoidal at the power frequency and in relative proportion to the controlled mark-space ratio. The sharing of load current between the first and second voltage sources may thus be adaptively controlled based on data provided to the switch controller. The data may for example relate to the amount of solar energy available to power the DC to AC inverter.

DETAILED DESCRIPTION

Figure 1:
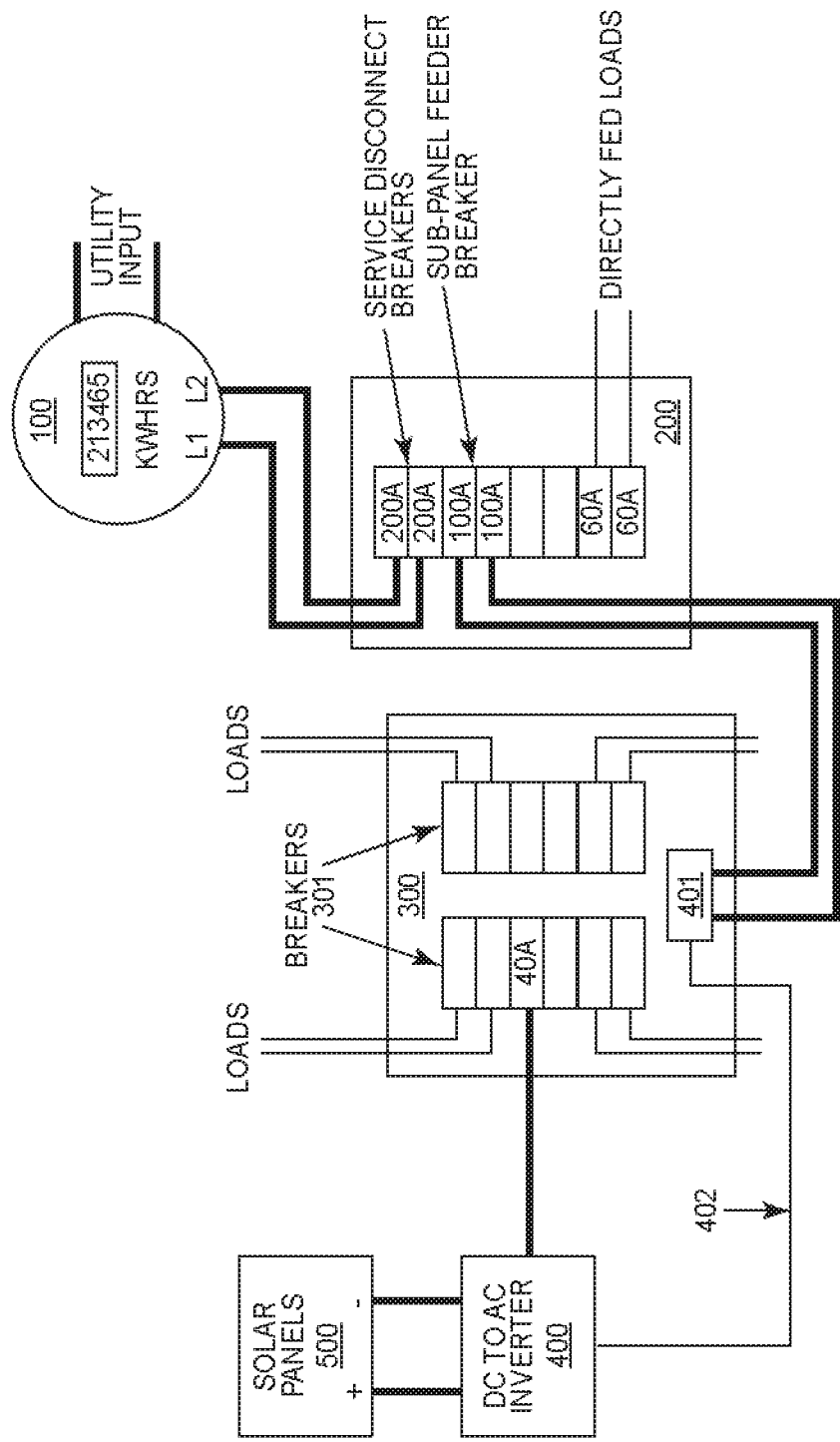
FIG. 1 shows a prior art "Utility Assist" inverter arrangement.

FIG. 1 shows a prior art connection for a utility assist inverter arrangement. Only live (hot) wiring is shown and neutral and ground wiring is omitted for simplicity, but shall of course be provided according to electrical code requirements.

An input from an electric utility grid is received through electric meter (100) to main service entrance panel (200). In the USA, residential service is 120/240 volt AC 60 Hz split-phase, having two 180-degree out-of-phase hotlegs of 120 volts with 240 volts available between them.

The service entrance panel contains service disconnect breakers and load breakers, and may be the only panel in some installations. FIG. 1 however shows an installation having also a sub-panel (300), which is fed from the service entrance panel through 100 amp feeder breakers. In the exemplary installation of FIG. 1, some loads are fed directly from the service panel and excluded from the loads which may be partly fed by the solar inverter. The remainder of the loads that may be partly fed from the solar inverter are fed from sub-panel (300) and the output from DC-to-AC inverter (400) is fed into a 40 amp back-feed breaker in sub-panel (300). The total current taken by sub-panel (300) from the service entrance panel (200) is measured by current measuring device (401) and is equal to the total load current supplied from sub-panel (300) minus the load current supplied from inverter (400).

Now, if the load current supplied from sub-panel (300) is partly on one phase and partly on the opposite phase, while the current supplied by inverter (400) is on a single phase, it may only be allowed to back-off the current taken from the same utility phase as that to which the inverter is connected. In fact a single-phase inverter is capable of backing-off current taken from both utility phases by relying on the utility pole transformer to transfer current to the other phase; however, the current taken from one phase could then be negative while the other is positive, and this may not be permitted or may not be handled correctly by meter (100), depending on its design. If a 240-volt DC-to-AC inverter is connected through a two-pole breaker in sub-panel (300), the same issue can arise when the load on one phase is less than the load on the opposite phase. Thus for either of the above-described inverter connections, utility validation and acceptance of the installation would be needed in the form of "connection permission". In some States, such a connection permission may entail a higher standing monthly charge to be paid to the utility company, which could negate the economics of installing this type of solar system.

In order to back-off utility consumption on both phases by current from DC-to-AC inverter (400), it would be necessary to use an inverter having two independently controllable anti-phase outputs. This would effectively be two inverters. Each output would be controlled to minimize the utility current drawn on the phase that it was supplying, as measured by current measuring device (401) while preventing that current from ever becoming negative. If the current is permitted to become negative, the installation is no longer merely a utility assist system, but is a grid-tied system, which may require a different type of connection permission and a different billing regime.

When DC-to-AC inverter (400) is fed from solar panels (500) without an energy storage device such as a battery, it cannot be guaranteed to be able to supply any particular number of loads as the amount solar insolation varies substantially and is of course zero at night. Therefore such an installation as in FIG. 1 must shut down if the utility fails. If it desired to continue to power loads when the utility is in outage, several modifications to FIG. 1 are required. The most important modification is that the connection between the utility and the powered loads must be broken. This can be done by inserting an automatically controlled service disconnect switch in the feeder cable from the feeder breakers in service entrance panel (200) to sub-panel (300).

The second modification is to insert an energy storage device (e.g. a battery) between the solar panels (500) and inverter (400). The third change is that the inverter must be of a type known as bimodal, which operates as a current source when in utility assist mode and as a voltage source when operating to power loads alone.

Figure 2:
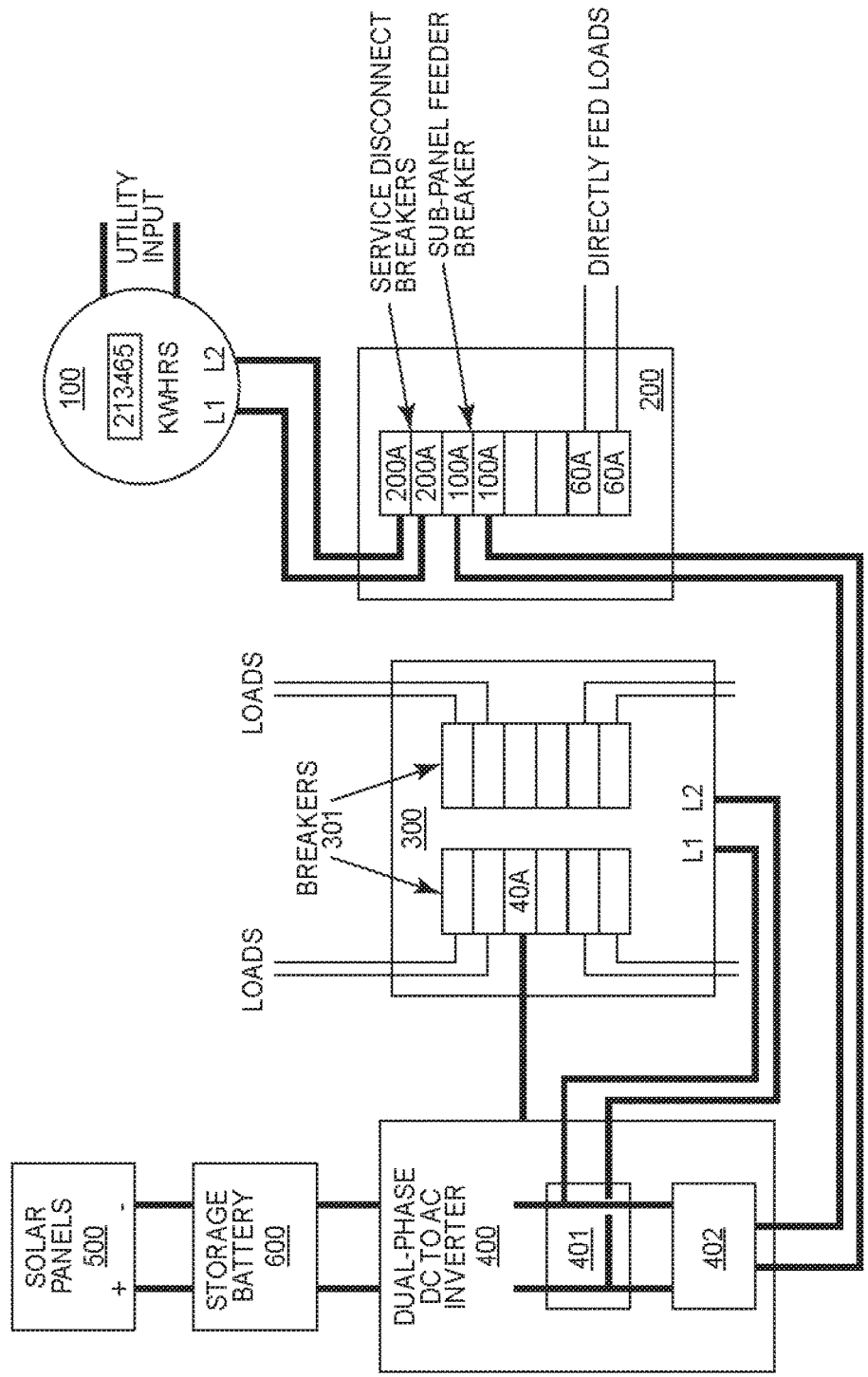
FIG. 2 shows a utility-assist system with a standalone capability

FIG. 2 shows another utility-assist configuration that is capable of powering loads during a utility outage. Storage battery (600) has been added between the DC output of solar panels (500) and the DC input of Inverter (400) in order to supply load power in the event of a utility outage. Several devices or functions that may customarily or optionally be included in the DC side of such an installation, including ground fault detection, arc fault detection, Maximum Power Point Tracking and battery charge controllers are not shown for simplicity, but may be added if required. These functions are disclosed in more detail in U.S. Pat. Nos. 9,190,836 and 8,937,822 to Applicant, which are hereby incorporated by reference herein in their entirety.

A second significant change between the prior art of FIG. 1 and the system of FIG. 2 is the introduction of isolation switch (402) to disconnect the utility supply if the utility should fail. Moreover, current measuring device (401) and isolation switch (402) have been relocated in a more logical position in the system, namely into inverter (400), in order to permit sub-panel (300) to be a standard sub-panel.

Sub-panel 300 now has a clear function: Since Inverter (400) will now attempt to power some but not all loads during a utility outage, the loads that it can support are fed from sub-panel (300) while the loads it cannot support are fed from service entrance panel (200). When the loads fed from sub-panel (300) are a particularly limited subset of all loads, sub-panel (300) is sometimes called "a subsistence panel". When the inverter has more power than a bare "subsistence" load sub-set would require however, the term "subsistence panel" may not adequately describe the extent of power that continues to be available during a utility power outage.

Among the current measurements that current measuring device (401) may perform, the important ones are the net currents flowing through isolation switch (402) and current measuring device (401) between service entrance panel (200) and the parallel connection of inverter (400) and sub-panel (300). It will be appreciated that within current measuring device (401), like phases (i.e. L1 or L2) from each of service entrance panel (200), inverter (400) and sub-panel (300) are effectively connected together in a Y junction. Nevertheless, the current in any or all of the three branches of each Y junction may be measured for each phase L1 and L2, making six potential current measurements in total. The measurement of net current flowing from the utility in each phase is used to control the inverter such that the net current drawn from the utility through the depicted 100A sub-panel feeder breakers is minimized but not permitted to become negative (i.e. not permitted to represent a reverse power flow to the grid). When however the grid fails, inverter (400) may supply however much current is required to power the loads in sub-panel (300).

Correct operation of the system of FIG. 2 is fraught with a number of difficulties as follows:

(a) Current taken by loads varies as appliances are switched on and off. Therefore when an appliance is switched off, the inverter may momentarily be causing reverse power flow to the grid during the time it takes to adapt down to the new load current. Thus prevention of reverse power flow can not be perfectly achieved. This may require the system to have the same connection permissions, unfavorable billing regime and onerous UL listing requirements as a grid-tied system.

(b) Detection of failure of the utility is required in order to throw isolation switch (402) and direct inverter (400) to supply loads with a controlled voltage. If the utility grid fails, because it is connected to the output of inverter (400), other upstream installations on the same utility supply branch are likely to so overload the inverter that its output voltage will collapse. This is indeed one way to detect that the utility has failed, but it is not instantaneous, and does not prevent the loads seeing at least a brown-out before action is taken and isolation switch (402) is thrown. If many similar installations exist in the same neighborhood, the phenomenon of "Islanding" can occur and then it may not be possible to detect a utility failure by a voltage brown-out alone. Instead, a frequency measurement may be performed and Islanding is indicated by a gradual drift of the AC frequency outside preset limits.

(c) Isolation switch 402 must handle the total possible feeder current of 100 A and is therefore likely to be a large and mechanically slow contactor. The duration of the brown-out may be sufficient to cause computers to reboot and alarm clocks to blink.

It is the purpose of the current invention to provide an improved response to utility failure while achieving all the advantages of a utility-assist system and avoiding the above disadvantages. This is achieved by a novel circuit that allows two electric power sources to share the burden of driving common loads without ever being connected together.

Figure 3:
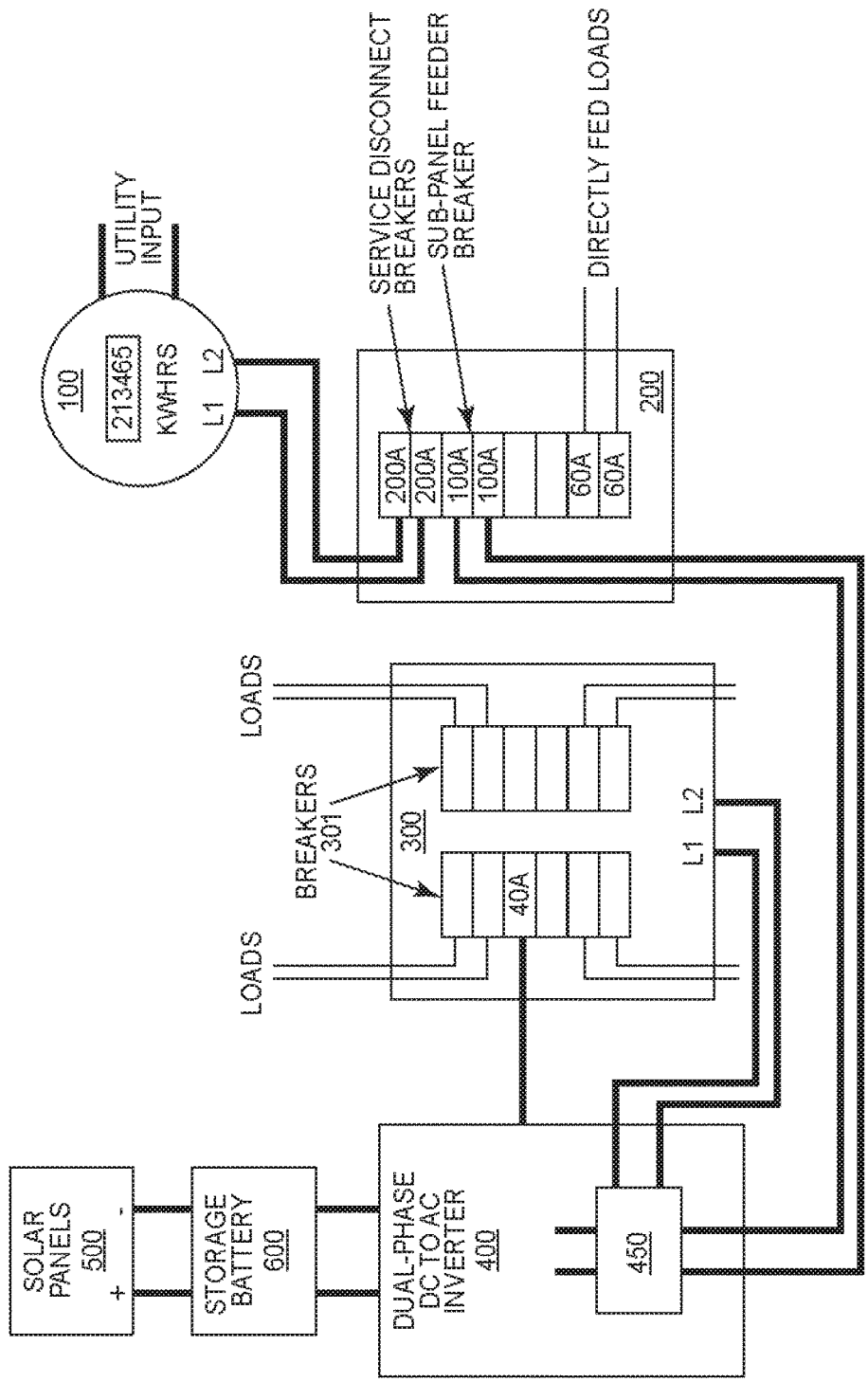
FIG. 3 shows the inventive utility-assist system with a standalone capability

FIG. 3 shows the inventive utility-assist system with standalone capability. The differences from FIG. 2 to FIG. 3 are that the isolation switch (402) has been removed and the current measuring device (401), which joined like phases of the inverter, sub-panel (300) and utility power from service entrance panel (200) in a Y-connection has been replaced by unit (450) which connects utility power from service entrance panel (200) and inverter (400) to sub-panel (300) in a new and inventive way. The inventive connection allows 60 Hz AC power to flow from inverter (400) and from service entrance panel (200) to the loads in sub-panel (300) simultaneously without ever making a connection between the utility feed from service entrance panel (200) and the power output connections of inverter (400). This feat may sound seemingly impossible until having examined the operation of the inventive, adaptive load-sharing device (1000) which is explained in more detail with the aid of FIG. 4.

Figure 4:
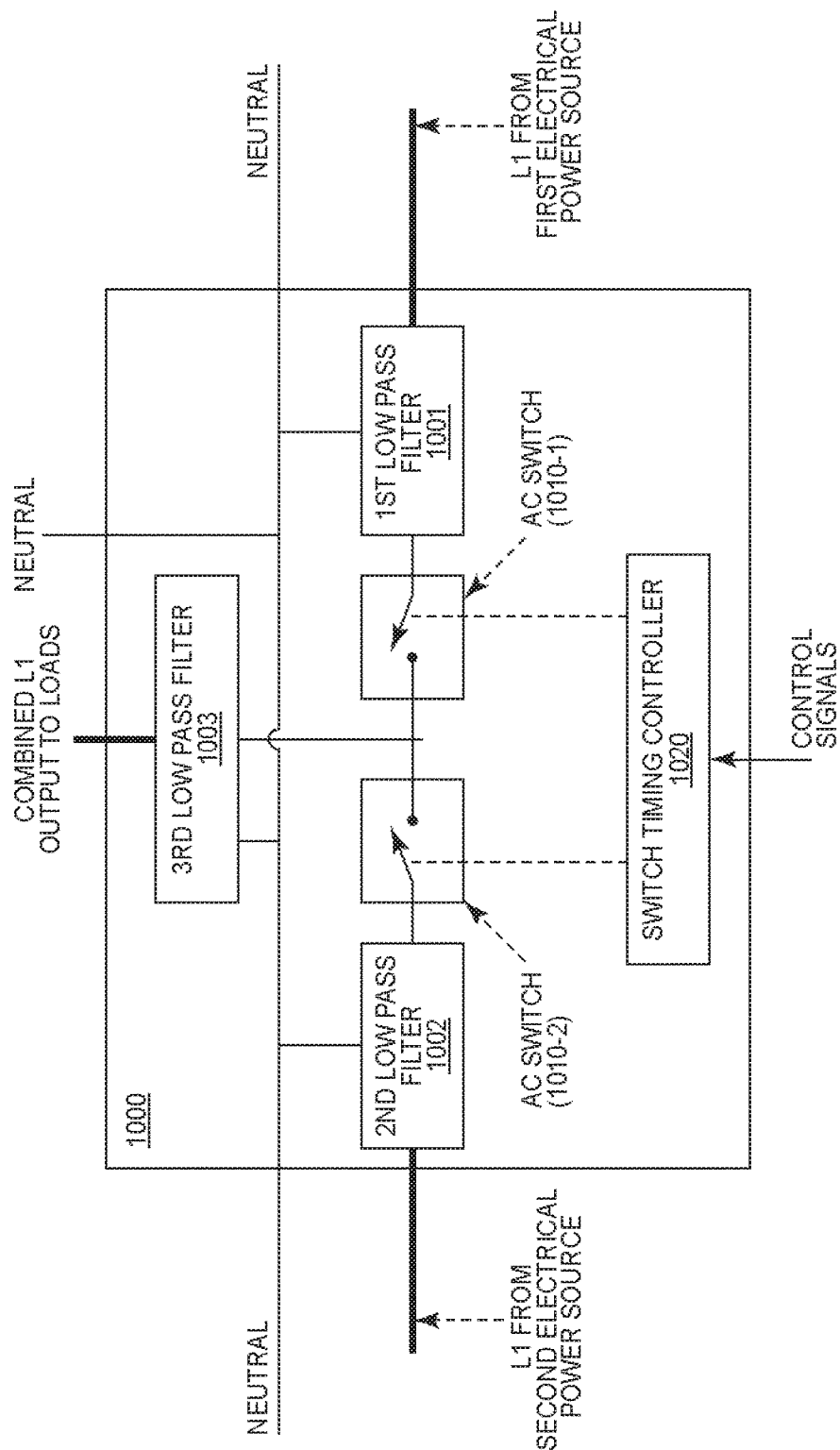
FIG. 4 shows the inventive load sharing circuit for a single phase

FIG. 4 illustrates an inventive load-sharing device (1000) having a first low pass filter (1001) receiving an input from phase L1 of a first electrical power source, a second low pass filter (1002) having an input for the same phase L 1 of a second electrical power source, and a third low pass filter (1003) for delivering a combined L 1 output to a load.

Low pass filters are two-port devices generally having a two-terminal input port and a two-terminal output port. The input and output ports may share a common terminal, e.g. ground, which, however, in the case of device (1000) is the neutral connection associated with the power sources and loads. The input port of filter (1001) is the L1 power and neutral from the first source; the input port of filter (1002) is the L1 power line and neutral of the second source, and the output port of filter (1003) is the output L1 line and neutral to the loads.

The output port of filter (1001) passes through AC switch (1010-1) to the input port of filter (1003) and the output port of filter (1002) passes through AC switch (1010-2) to the input port of filter (1003). As long as both AC switches are never closed at the same time, there is therefore never a connection between the L 1's of the first and second power sources. Switch timing controller (1020) controls the closing of switches (1010-1) and (1010-2) while imposing the condition that they shall never be closed at the same time. In fact, controller (1020) can control switch (1010-1) to open substantially at the same time as it controls switch (1010-2) to close and vice versa, thus ensuring that one or other of the first or second power source is always connected through low pass filter (1003) to the load.

AC switches (1010-1, 1010-2) can be fabricated with fast-switching semiconductor devices, as will be further explained below. Timing controller (1020) can operate such switches to close alternately at very high frequencies, for example 100,000 times per second or more, and in a specified mark/space ratio defined by an external control signal applied to timing controller (1020). For example, if the switches are operated alternately at a cycle frequency of 100 KHz, that is a periodicity of 10 uS, switch (1010-1) may be closed for 3 uS out of the 10 uS period while switch (1010-2) is open, alternating with switch (1010-2) being closed for 7 uS while switch (1010-1) is open. Thus current is drawn from the first source ³⁄₁₀ths of the time while current is drawn form the second source ⁷⁄₁₀ths of the time. When low pass filters (1001,1002) have cut-off frequencies substantially lower than the 100 KHz exemplary cycle frequency, the power sources simply see a mean current demand of 0.3 and 0.7 of the load respectively. Thus by controlling the mark/space ratio, it is possible to control the proportion of the load current borne by the first and second power sources.

Figure 5:
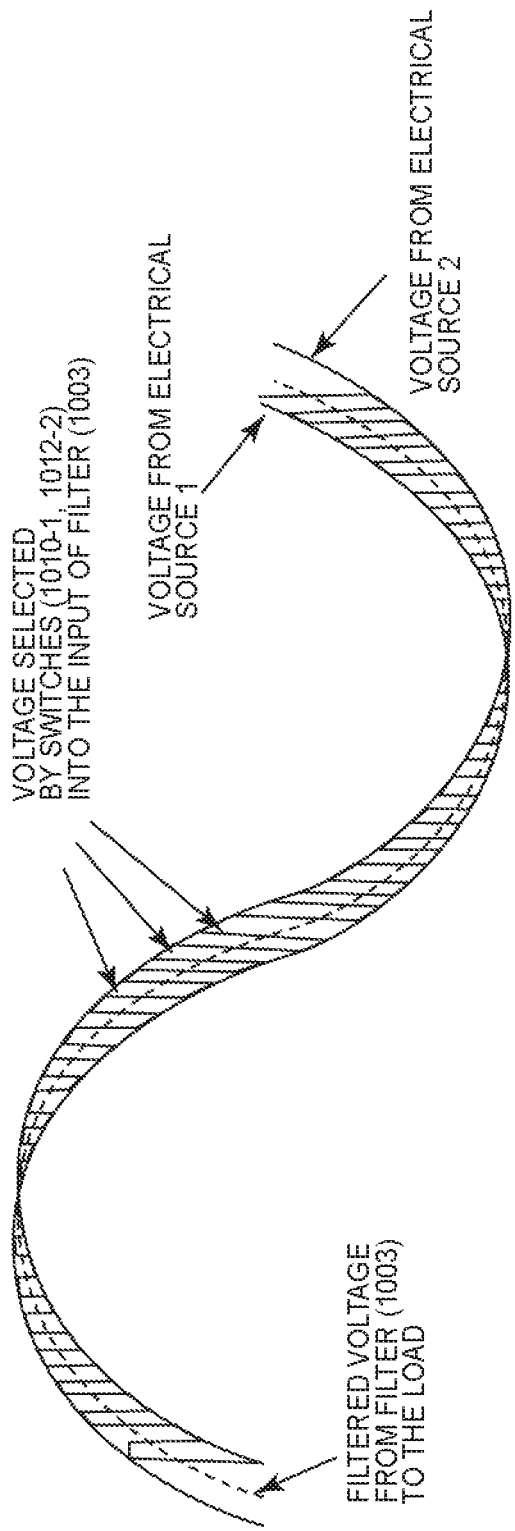
FIG. 5 shows the effect of rapidly selecting between roughly synchronized sources

FIG. 5 illustrates the case where the AC voltage waveforms of the first and second power sources are only approximately synchronized. The first and second sources supply sinusoidal voltage waveforms which, as illustrated, are of approximately the same voltage amplitude but slightly displaced in phase. Switches (1010-1,1010-2) select rapidly between the two sources producing the tessellated waveform bounded by the two source waveforms. If the two waveforms were accurately synchronized, the tessellations would represent a negligible voltage excursion when switching from one source to the other source, and no low pass filter (1003) would be needed to remove the tessellations. The use of low pass filter (1003) however removes the high-frequency tessellations even when the sources are only approximately synchronized, producing a smoothed sinusoidal voltage into the load which is simply $(aV1+bV2)/(a+b)$ where a/b is the ratio of the time for which source 1 is selected to the time for which source 2 is selected.

Assuming now a load impedance of $Z=(R+jX)$ ohms, the load current would be

Iload=(aV1/Z+bV2/Z)/(a+b)=(aI1+bI2)/(a+b) where I1 is the current that would flow if source 1 were selected all the time and I2 is the current that would flow if source 2 were selected all the time. The actual current is split between the two sources in the same way as the mean load voltage is split between V1 and V2. This suggests that the arrangement is electrically equivalent to the transformer series coupling of the two sources to the load as shown in FIG. 6.

Figure 6:
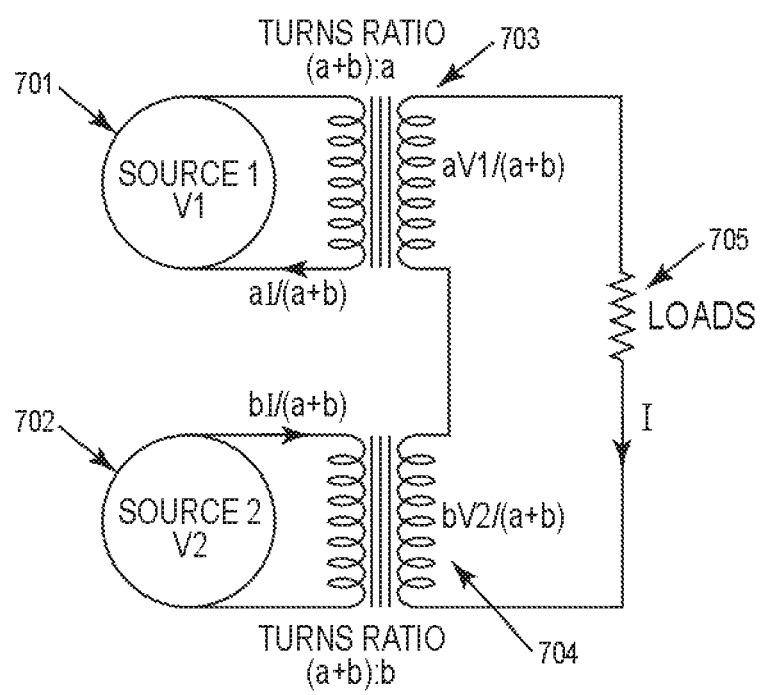
FIG. 6 shows an equivalent transformer circuit FIGS. 7A, B and C illustrate phasor diagrams for combining source voltages

FIG. 6 shows a transformer (703) having primary-to-secondary turns ratio of (a+b):a to reduce the voltage from source 1 (701) from V1 to aV1/(a+b). A similar transformer (704) with turns ratio b:(a+b) reduces the voltage from source 2 (702) from V2 to bV2/(a+b). The two secondaries are connected in series to produce a voltage (aV1+bV2)/(a+b) into load 705 causing a current I to flow. When the two voltages V1 and V2 are both equal to V, it may be seen that the voltage applied to the load is also equal to V. It may also be seen that if a=b, then the voltage delivered to the load is the mean of V1 and V2.

The transformers also divide the load current so that a current of aI/(a+b) flows from source 1 and a current bI/(a+b) flows from source 2. The main difference in character between the circuits of FIG. 5 and FIG. 6 however is that in FIG. 5, the turns ratios are continuously variable by changing the mark/space ratio of switch selection.

We now examine with the aid of FIG. 6 the circumstances under which power could flow backwards into one source from the other.

FIGS. 7 A,B and C illustrate with a phasor diagrams the combination of the voltages from two power sources by the transformer equivalent circuit of FIG. 6, and by equivalence, also by the circuit of FIG. 5.

Figure 7C:
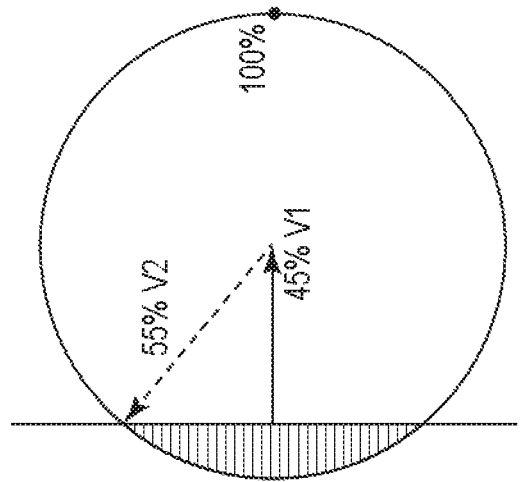
Figure 7B:
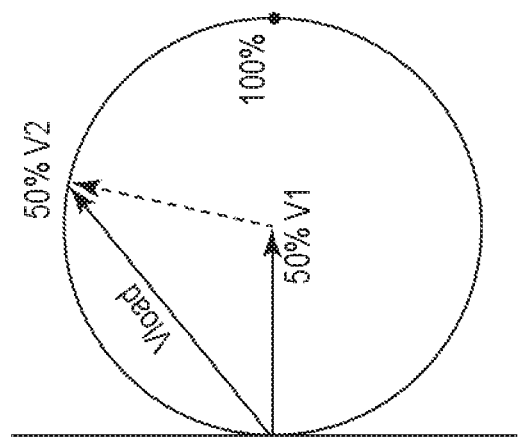
Figure 7A:
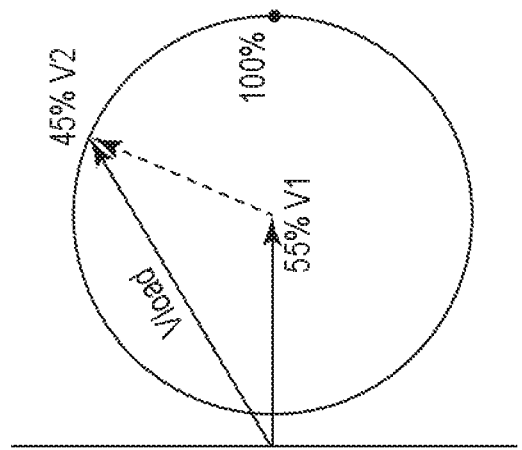

FIG. 7A illustrates the case where the two source voltages V1 and V2 are roughly equal, but the factor "a" is 55% and the factor "b" is 45%. V1 is taken as the reference phase (0 degrees) and so is horizontal vector. If V2 was in phase with V1, the resultant Vload would be 100% of V1 or V2, which is the desired operating point. When V2 has a substantial phase difference compared to V1 however, the resultant Vload is less than 100% and has a phase angle between that of V1 and V2, as illustrated in FIG. 7A. If the load is resistive, the angle of Vload is also the angle of the load current. It is seen that this has a positive projection on V1, implying that power is drawn from the source V1. If all possible phase angles of V2 are explored, the resultant can lie anywhere on the circle of FIG. 7A, but the resultant always has a positive projection on V1, and so power from source V1 is always positive.

In FIG. 7B, the scaling factors "a" and "b" are such that the scaled values of V1 and V2 are equal. The circle traced out by all possible phase angles of V2 relative to V1 now passes through the origin, at which point the load voltage would be zero and no current would be drawn from V1 or V2.

In FIG. 7C, the scaling factors "a" and "b" are such the scaled values of V1 and V2 are equal. The circle traced out by all possible phase angles of V2 relative to V1 now passes through the origin, at which point the load voltage would be zero and no current would be drawn from V1 or V2.

Applying the conclusions of FIG. 7 to the problem in hand, it may be concluded that power can only be fed back to the grid from the solar inverter (400) of FIG. 3 if its output voltage exceeds that of the grid and it is grossly mis-synchronized.

Ensuring that the inverter voltage is nearly equal to or less than the grid voltage and that it is roughly in phase synchronism with the grid are two conditions that are much easier to monitor and control than ensuring that the prior art current-mode inverter (400) of FIG. 1 never feeds power back to the grid. Moreover, the Inverter may now operate in voltage-mode all the time, which is the mode required to power loads when the utility is in outage.

Figure 8:
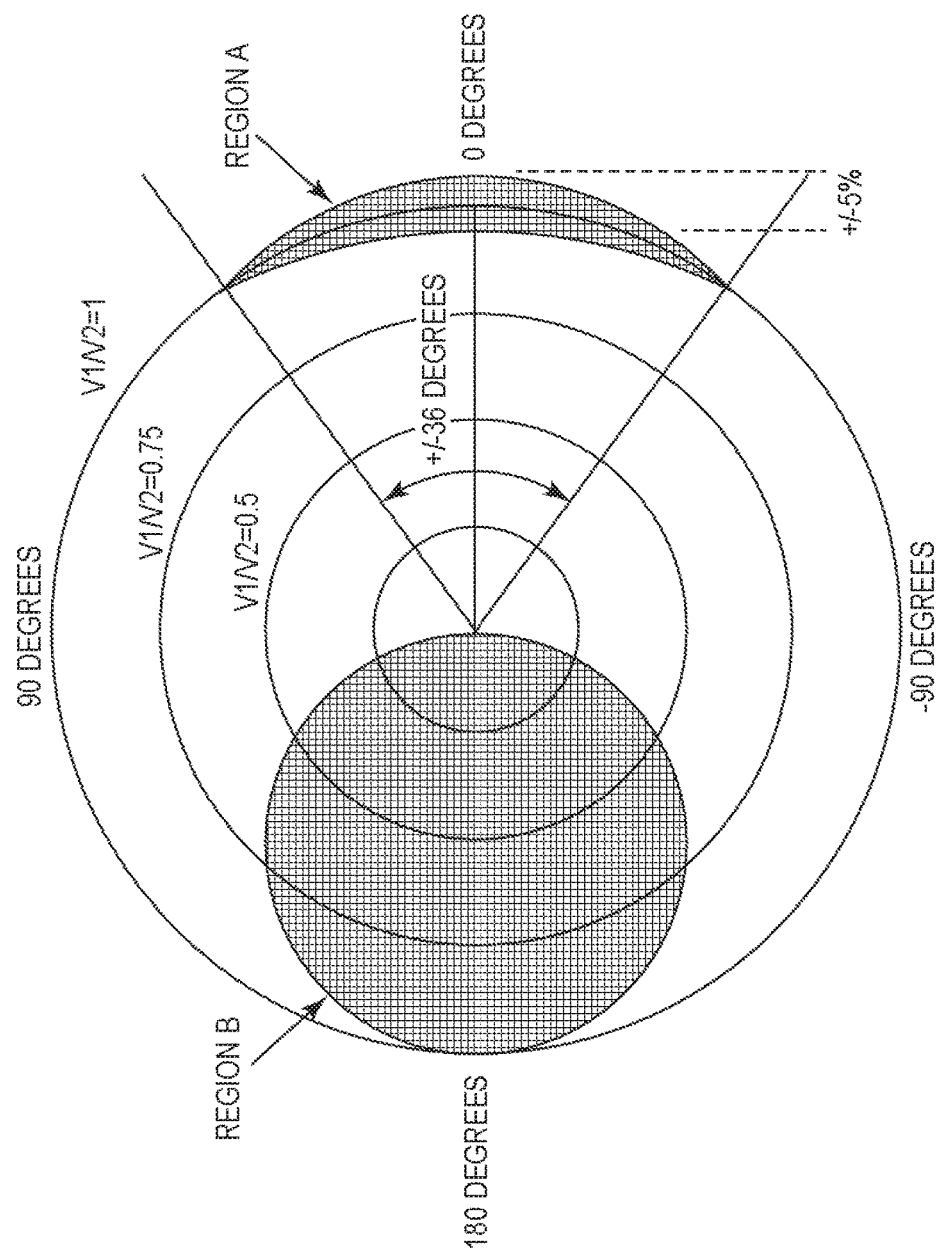
FIG. 8 shows the target operating region and the disallowed region

FIG. 8 summarizes the regions of relative voltage and relative phase constituting the desired operating region, shown as shaded region A, and the disallowed region of reverse power flow, annotated as Region B. Since it is desired to be able to power the load either entirely from the utility (V1) or entirely from the solar inverter (V2), V1 and V2 should be within +/−5% of each other to avoid any noticeable change in appliance operation. Furthermore, when powered half from utility and half from solar (a=b=50%), the combined voltage should also be within 5% of normal. This occurs with a phase mis-synchronisation between V1 and V2 of as much as +/−36 degrees when V1=V2, thus giving rise to shaded region A as the target operating region. When powering half from utility and half from inverter with V1=V2 and a=b=50%, this corresponds to the V1/V2=1 circle of FIG. 8, showing that no reverse power flow can occur unless the phase error were the maximum 180 degrees, and this would not satisfy the load voltage regulation requirements either.

When powering ⅔rds from solar and ⅓rd from utility with V1=V2, the ratio of the combined voltages is on the V1/V2=0.5 circle of FIG. 8. The phase error must still be a very large 120 degrees before reverse power flow from inverter to utility occurs. Even powering nearly 100% from inverter causes no utility reverse power flow with phase errors as much as 90 degrees.

One advantage of the invention is that the voltage V1 of the utility and the voltage V2 of the inverter can be measured totally independently of each other, as the one does not affect the other, unlike the prior art of FIG. 2 where utility and inverter are connected directly in parallel. Thus the relative voltage and relative phase of utility and inverter are easy to measure independently and continuously when using the invention. This also allows instantaneous detection of a utility brown-out and a substantially instantaneous reaction to fill the brown-out with inverter power, thus achieving much cleaner power.

Figure 9:
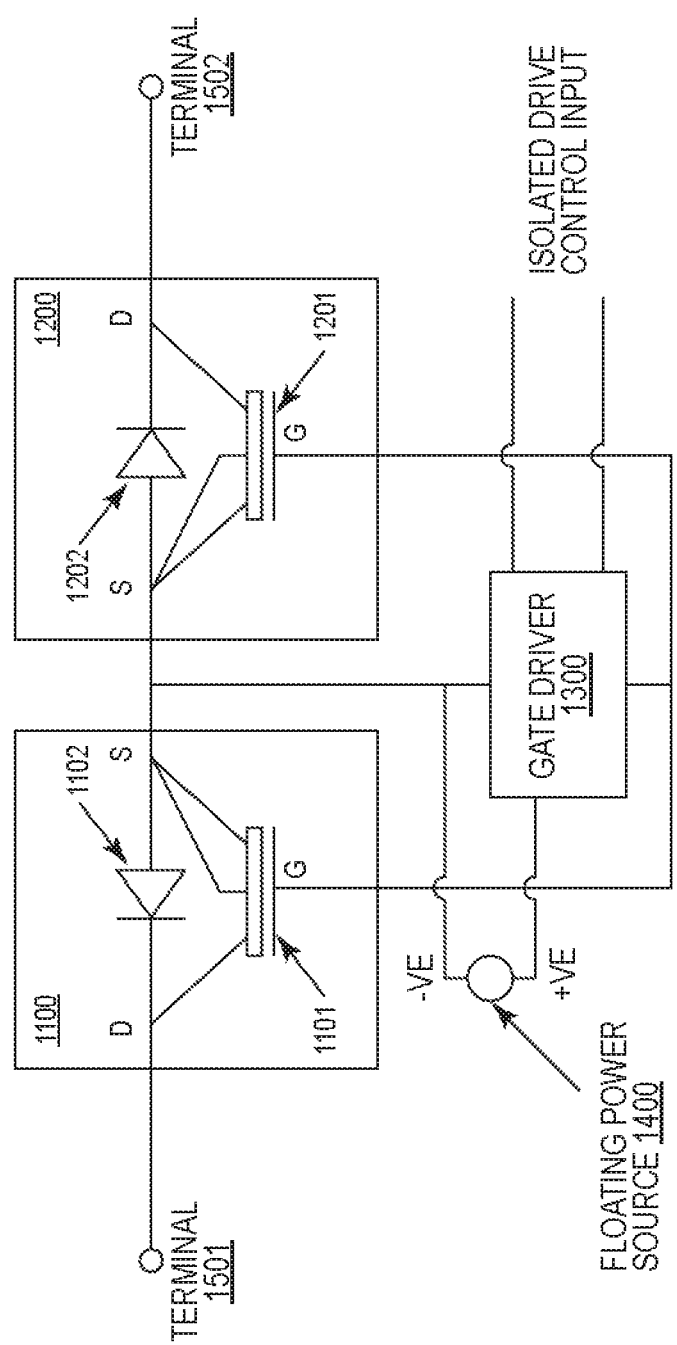
FIG. 9 shows a fast, semiconductor AC power switch suitable for the invention

FIG. 9 shows one arrangement for power switches (1010-1 and 2 of FIG. 4) suitable for use in the invention. Two MOSFETs (1100,1200) are connected back-to-back at their source terminals (s). Their drain terminals (d) become the switch contacts. Since the circuit is symmetrical, it doesn't matter which drain terminal is considered the input and which the output. The gates (g) are also connected together and the connected gates are driven with respect to the connected sources by a gate driver chip (1300) powered from an isolated power supply of the order of 10-15 volts DC.

Gate driver chips generally provide isolation between the control logic input and the output, allowing the control on/off logic signal to come from a control circuit that is not isolated, and may be connected to ground.

The operation of the circuit of FIG. 9 is as follows. Suppose terminal 1501 is connected to an AC source of 120 volts rms, that is swinging between −170 and +170 volts peak, and that terminal 1502 is connected through a load to the neutral or return wire to the source. If the switch is off, driver chip (1300) maintains a gate potential close to the source potential. To turn the switch on, the driver chip applies a positive bias to the MOSFET gates of between 10 and 15 volts.

With the MOSFETs OFF, when terminal 1501 swings positive, intrinsic diode 1102 becomes reverse biased and there is no current path to transistor (1200) or beyond. When terminal 1501 swings negative, diode 1102 conducts and transfers the −ve voltage to the sources (s) of both transistors. However, intrinsic diode 1202 of transistor (1200) is then reverse biased and there is no current path through to terminal 1502 or beyond. Thus for both negative and positive voltage swings on the input terminal relative to the output terminal, no current flows when the switch is off. On the other hand, when gate driver chip (1300) makes the gates of transistors (1100,1200) positive with respect to their sources, both MOSFET channels (1101,1201) are in a low impedance state, allowing current to flow from the input terminal to the output terminal with low voltage drop. The series loss resistance of the complete switch of FIG. 9 is equal to the sum of the ON-resistances (RdsON) of the two MOSFETs. Each MOSFET needs to be able to withstand a voltage of twice the AC input peak voltage in the OFF condition to survive the case of the input and output being in anti-phase. Thus at least 340 volts is required, plus some margin. A suitable transistor is the Fairchild part number FCH76N60N which has a 600 volt breakdown. Its RdsON is typically 28 milliohms, giving a switch loss resistance of typically 56 milliohms. This gives just over 1 volt loss with 20 amps flowing, representing an efficiency of 99%. If desired, several such transistors can be used in parallel to reduce the loss resistance and allow for greater current flow. For example, if each MOSFET were composed of three FCH76N60N:s in parallel, the voltage loss would be just over 1 volt with 60 amps flowing.

Low pass filters (1001,1002) connecting the power sources to the switches may comprise a series inductor and a parallel capacitor, the parallel capacitor being on the switch side. Low pass filter (1003) can also comprise a series inductor and parallel capacitor, with the series inductor on the switch side and the capacitor on the output to the loads. This is because the switches alternately switch one source or the other into low pass filter (1003), and when the instantaneous source voltages are slightly different, attempting to cause an instantaneous voltage change on a capacitor would cause high current spikes, which is to be avoided. On the other hand, if there should be a very short period on the order of 100nS or so where both switches are off, any current flow in the series inductor of filter (1003) attempts to continue to flow by causing a large voltage spike. Catching diodes would be recommended to limit the voltage spike. Greater circuit detail of the load-sharing arrangement of FIG. 4 is provided in FIG. 10 to elaborate on this issue.

Figure 10:
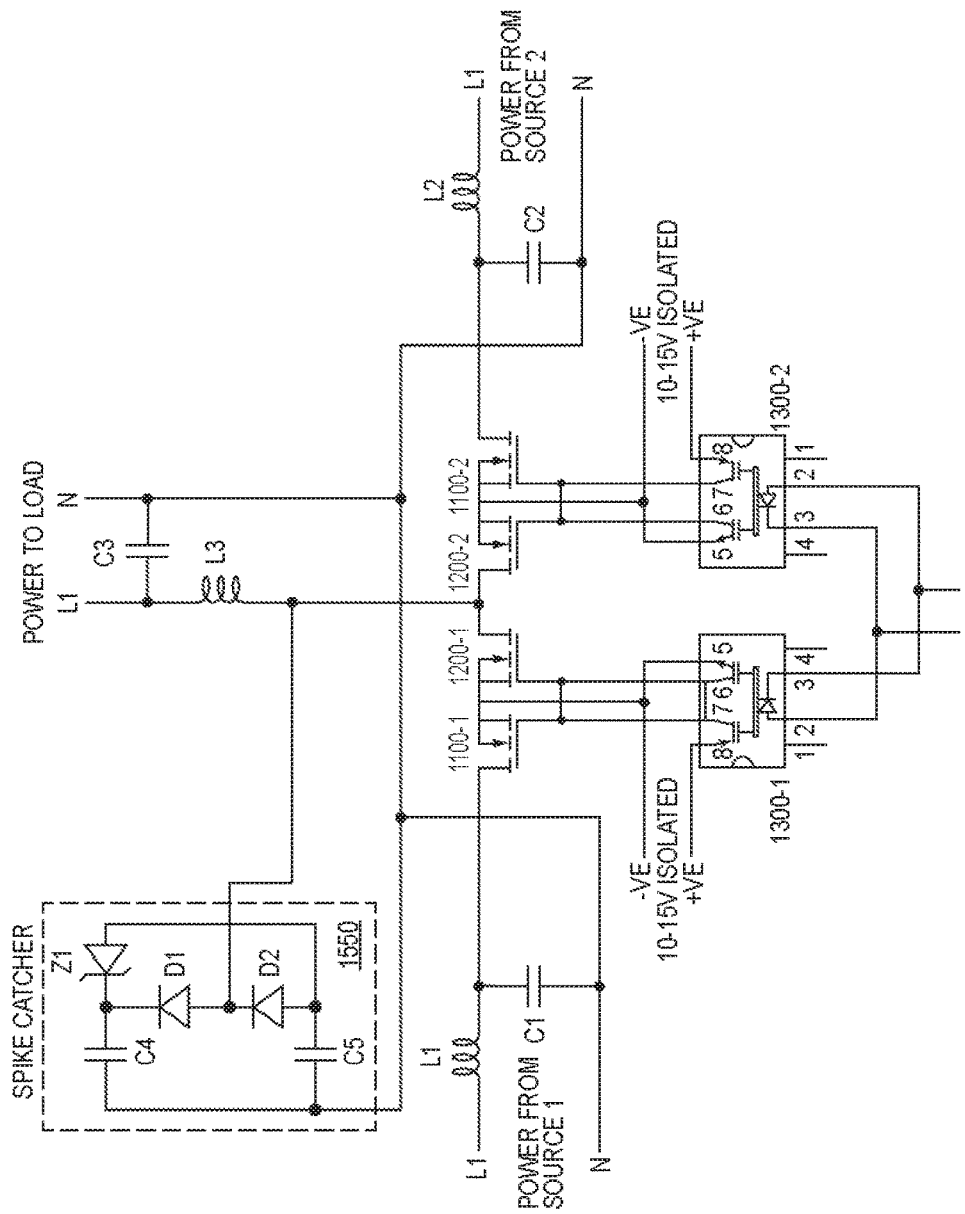
FIG. 10 shows more details of the switches and low pass filters.

FIG. 10 shows power coming from source 1 through a first LC filter comprised of L1,C1 to a switch composed of MOSFETs 1100-1 and 1200-1, joined at their sources and gates. The gates are driven by opto-isolated gate driver 1300-1, which may be a Fairchild part number FOD3180. Power also comes from source 2 through a second LC filter composed of L2,C2 to a second switch composed of MOSFETs 1100-2 and 1200-2 also with their gates and sources commoned. The second switch gates are driven by a second opto-isolated gate driver (1300-2). Gate drivers 1300-1 and 1300-2 are powered by separate, mutually isolated DC supplies in the 10-15 volt range. According as gate driver 1300-1 or 1300-2 is controlled to turn on its respective switch transistors, one or other of the selected sources is connected through 1200-1 or 1200-2 to the third low pass filter composed of L3 and C3. According as gate driver 1300-1 or 1300-2 is controlled to turn on its respective switch transistors, either source 1 or source 2 is selected to pass its voltage through to the third low pass filter comprised of L3 and C3.

Now it is to be avoided that switch (1100-1,1200-1) be ON at the same time as switch (1100-2,1200-2), and since it is difficult to guarantee exact simultaneity, there is likely to be a time where both are OFF. During the "both OFF" period, L3 continues to attempt to maintain current flow by making the voltage fly in such a direction as to keep the current flowing. If the voltage is positive at the junction of 1200-1 and 1200-2 and the current is flowing into L3 from that junction, the voltage will fly negative causing the intrinsic diodes of 1200-1 and 1200-2 to conduct and pass the negative spike through to 1100-1 and 1100-2. To avoid the voltage spike exceeding the breakdown voltage of 1100-1 and 2, diode D2 of Spike Catcher circuit (1550) bypasses the current into C5 causing it to charge negatively. Conversely, if the voltage at L3 was negative and the current was out of L3 towards the junction of 1200-1 and 1200-2, L3 will attempt to maintain the current when both switches are off by making the voltage fly positive, risking breakdown of 1200-1 or 1200-2. To prevent this, Spike Catcher diode D1 bypasses positive spike current into C4 causing it charge positively. The difference in voltage between C4 and C5 is constrained by zener diode Z1 (or some circuit equivalent to a zener diode) to be no more than 400 volts, say, where that is less than the breakdown voltage of the MOSFETs.

Suppose the instantaneous load current is 84 amps, corresponding to the peak of an AC current of 60 amps RMS, and suppose the period for which both transistors are off is 100 nS, and that that occurs upon each of two switch changes every 10 uS. Then that 84 amps is bypassed to either C4 or C5 for a total of 200 nS out of 10 uS, which is 2% of the time. The mean current is thus 2% of 84 amps or 1.68 amps at the peak of the AC cycle. Averaged over a half cycle gives the mean over a cycle of 1.68 amps/π=535 mA into both of C4 and C5, Therefore Zener diode Z1 would be dissipating a power of the order of 535 mA times 400v, or about watts. The AC actually flowing when the current is 60 amps rms is 120 volts×60 amps, =7.2 Kw. The spike loss therefore is of the order of 1/36 of the power, or around 2.7%. This reduces the efficiency of the circuit. Therefore alternative means to control spikes is sought that avoids the power loss in spike catcher (1550).

Figure 11:
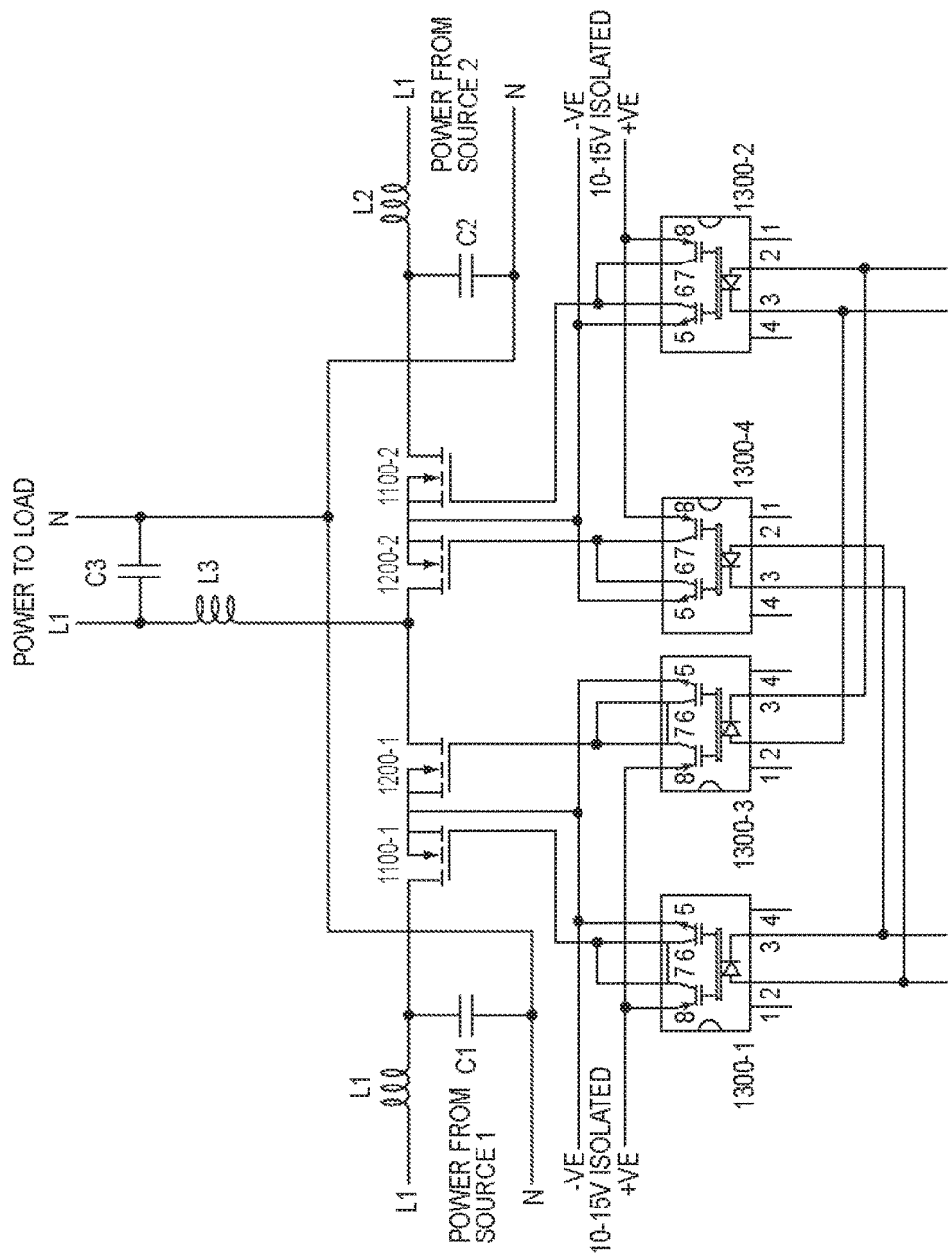
FIG. 11 shows addition of Spike Catching diodes.

To eliminate switching spikes, the four switch transistors may be controlled in a deliberate sequence by using four independently controlled gate drivers, as shown in FIG. 11. In FIG. 11, gate driver 1300-1 controls only MOSFET 1100-1 while gate driver 1300-3 controls 1200-1. Likewise, gate driver 1300-2 controls only MOSFET 1100-2 while gate driver 1300-4 controls MOSFET 1200-2. Thus the timing of switching each MOSFET on or off is controllable independently.

Now suppose that the voltage at L3 is instantaneously positive and that current is being supplied through MOSFETs 1100-1 and 1200-1 from source 1. To switch off switch (1100-1,1200-1), gate driver 1300-3 is first controlled to switch off MOSFET 1200-1 while leaving MOSFET 1100-1 in the ON state. The voltage at the junction of 1200-1 and 1200-2 will now attempt to fly negative, causing the intrinsic diode of MOSFET 1200-1 to conduct and draw the current through the still ON 1100-1. Thus, despite half of switch (1100-2,1200-1) now being off, current still flows from source 1 to the load and there is no spike.

At the same instant, 1200-1 is turned off, 1100-2 may be turned on to prepare to take the current from source 2. If source 2 is momentarily at a slightly higher voltage than source 1, then it is the intrinsic diode of 1200-2 that will catch the spike and maintain L3 current from source 2 instead of source 1. In fact, the intrinsic diodes of OFF transistors 1200-1 and 1200-2 form a diode-OR that passes whichever is the more positive voltage, source 1 or source 2, to L3.

At this point transistor 1100-1 may be turned OFF as the current will be maintained through the intrinsic diode of 1200-2 and ON transistor 1100-2. Finally, transistor 1200-2 may be turned on to reduce its voltage drop to less than that of its intrinsic diode. Thus a successful transition from switch (1100-1,12001) being ON with switch (1100-2, 12002) OFF to the opposite state, without current or voltage spikes.

When the voltage from source 1 and/or source 2 to L3 is momentarily in the negative part of the AC cycle, the switching sequence is as follows.

Suppose switch (1100-1,1200-1) is on and passing a negative voltage to L3 and passing a negative current from L3 to source 1. Switching this switch off would thus a cause a positive voltage spike at L3. To avoid the spike, MOSFET 1100-1 is now turned OFF first while leaving 1200-1 ON. The voltage at L3 attempts to spike positive, but is now caught by the intrinsic diode of 1100-1, maintaining the current flow to source 1. At the same time, MOSFET 1200-2 may be turned ON to prepare to take current from source 2. Current will actually then flow to whichever source is at the more negative voltage, due to the diode-OR formed by the intrinsic diodes of OFF transistors 1100-1 and 1100-2. MOSFET 1200-1 may then be turned OFF and current will continue to flow through now ON transistor 1200-2 and the intrinsic diode of 1100-2. Finally, MOSFET 1100-2 is turned on to short out its intrinsic diode and reduce voltage drop.

When the load is not resistive, the current through L3 will not be exactly in phase with the voltage. It is the direction of the current that preferably determines which of the above two sequences is used, rather than the sign of the voltage at L3. Thus the current direction though L3 may be sensed with any suitable current sensor to control the selection of the switching sequence for that half cycle. If instead the sign of the voltage is used, the Spike Catcher (1550 of FIG. 10) will likely still be needed to deal with reactive loads, but the loss of power in the Spike Catcher will now be proportional to the reactive power, which is generally significantly smaller than the resistive power, and so will not hurt efficiency so much. Since it is possible that load current could be zero, switching can also depend upon whether the current is of a sufficient magnitude to reliably use as a switching sequence selection mechanism, with voltage sign being used by default.

Figure 12:
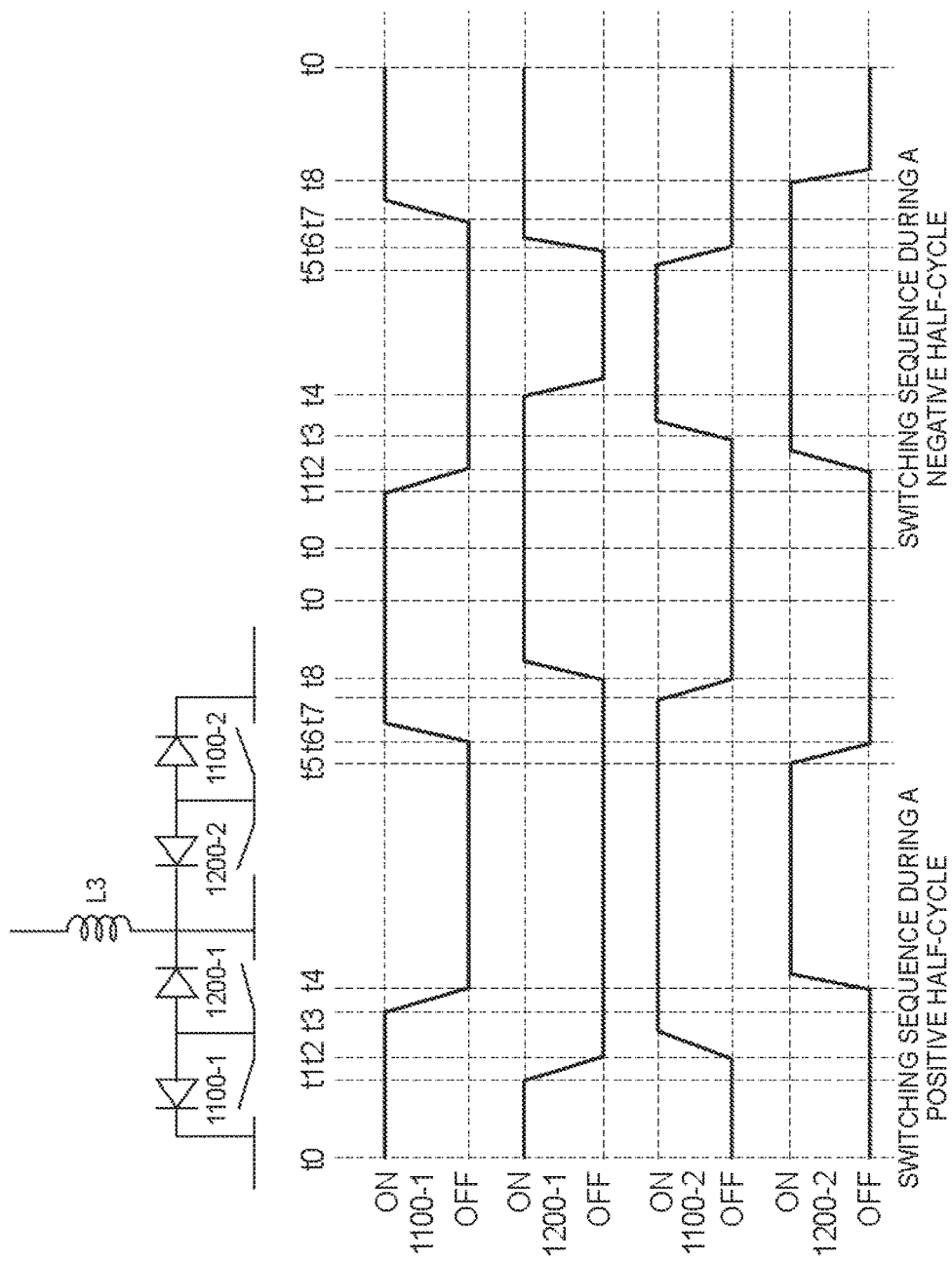
FIG. 12 shows a transistor switching sequence that avoids switching spikes.

FIG. 12 shows the switching waveforms of the four MOSFETs for the positive and negative half cycles respectively.

The left half of the waveform diagram shows the switching sequence during a positive half cycle of the AC waveform (voltage or current, as discussed above).

A time t0, switch (1100-1,1200-1) is ON while switch (1100-2,1200-2) is OFF. At time t1. MOSFET 1200-1 starts to be turned off while almost simultaneously at time t2, transistor 1100-2 starts to be turned on. When the current in L3 is positive, the current will attempt to continue to flow through the intrinsic diode of the now OFF transistor 1200-1. As soon as 1100-2 is also ON, the current may also flow through the intrinsic diode of OFF transistor 1200-2 and the ON transistor 1100-2. The two sources are not connected together because both 1200-1 and 1200-2 are off, and all that can happen is that their respective intrinsic diodes act to select the more positive of the source voltages to pass to L3. After giving 1100-2 enough time to turn on, 1100-1 can be turned off at t3. Thus it is ensured that at least one source or the other is connected through to L3 via the intrinsic diode of 1200-1 or 1200-2, thereby avoiding an inductive switching spike. When it is certain that 1100-1 is OFF and 1100-2 is ON, 1200-2 is turned on at t4 to short its intrinsic diode to reduce voltage loss. Switch (1100-1,1200-1) has thus been turned off and switch (1100-2,1200-2) has been turned on, and will remain ON until t5.

At time t5, a reverse transition from switch 2 ON back to switch 1 ON is commenced. This is essentially the same sequence with the "-1" and "-2" transistors interchanged. After t8, switch 1 is back ON again and switch 2 is OFF, and this state prevails until the second time labeled also to to indicate a return to the beginning of the cycle.

The right half of the waveform diagrams of FIG. 12 show the switching sequence during a negative half cycle (of current or voltage). These times are also labeled t0 to t8 but in the following description of the negative half cycle switching sequence these times refer to those instants in the right half of the waveform diagrams.

At the first time t0 of the negative half cycle, switch 1 is ON and switch 2 is OFF. The changeover from switch 1 ON to switch 2 ON now commences at time t1 by turning off 1100-1. This is because a negative current can now continue to flow through the intrinsic diode of 1100-1 even though the transistor is OFF, thus averting a positive switching spike. Almost simultaneously, at t2, 1200-2 is turned on. Now both 1200-1 and 1200-2 are ON, but the two sources are not connected together because 1100-1 and 1100-2 are both off, and all that happens is that the intrinsic diodes of 1100-1 and 1100-2 act to select the more negative voltage of source 1 and 2 to be passed through to L3. As both 1200-1 and 1200-2 are ON at this point, a sufficient time must be allowed for 1100-1 to be fully off before turning 1100-2 on at t3. After allowing sufficient time for 1100-2 to be fully on, 1200-1 may be turned off at t4. This sequence ensures that there is always a path for negative current to flow to either source 1 or 2 during the switching cycle, thereby avoiding high-voltage switching spikes.

The reverse transition from switch 2 ON and switch 1 OFF to the opposite state begins at t5, where 1100-2 is first turned off as compared to 1100-1 in the previous paragraph. Likewise the second action is to turn 1200-1 on at t6 instead of 1200-2 on, as in the previous paragraph. the reverse transition is completed by turning 1100-1 on at t7 and 1200-2 off at t8. Now switch 1 is back on while switch 2 is off, and this condition prevails until the second time t0 which is the start of a switching cycle again.

Figure 13:
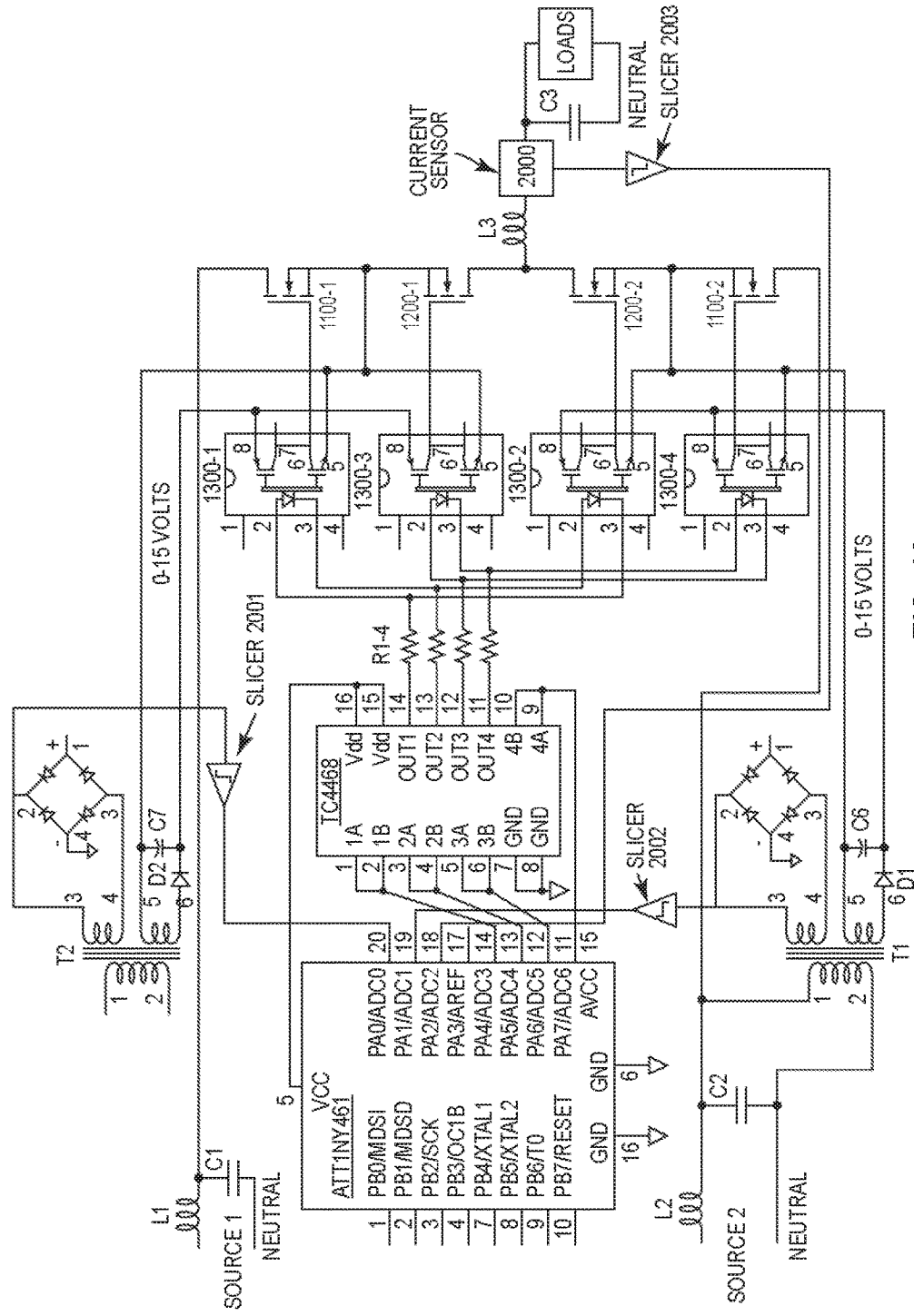
FIG. 13 shows a microprocessor-based timing controller circuit.

FIG. 13 shows the circuit of a switching timing controller that implements the above switching sequence. Opto-isolared drivers 1300-1 and 1300-3 have their LED input diodes connected back to back so that when one is biased ON the other must be biassed OFF. Opto-isolated drivers 1300-2 and 1300-4 are connected likewise. High output current buffer type TC4468 supplies either 0 or a +5v Vee through resistors R1 to R4 to these input LEOs. With a logic One (+5v) at output pin 14 of the TC4468 and a logic Zero (0 volts) at pin13, the input LED of opto-driver 1300-1 will be turned on and MOSFET 1100-1 will be turned on with MOSFET 1200-2 OFF. With a logic Zero at pin 14 and a logic One at pin 13 of the TC4468 MOSFET 1200-2 will be turned on and MOSFET 1100-1 will be OFF. Output pins 11 and 12 of the TC4468 control MOSFETs 1100-2 and 1200-1 likewise.

Microprocessor ATTINY461 is programmed to issue logic signals from its pins 11,12,13,14 respectively to control the corresponding output pins of the TC4468. The sequence of logic signals issued can depend on either the signs of the source voltages, which are conveyed to it through Slicers 2001 and 2002 respectively, or the sign of the current measured by current sensor (2000) conveyed to the microprocessor through slicer 2003. If the sign of the current is positive, the sequence of logic signals issued is as shown in the table below

| Pin 14 | Pin 13 | Pin 11 | Pin 12 | 1100-1 | 1200-2 | 1100-2 | 1200-1 |
|---|---|---|---|---|---|---|---|
| 1 | 0 | 0 | 1 | ON | OFF | OFF | ON |
| 1 | 0 | 1 | 0 | ON | OFF | ON | OFF |
| 0 | 1 | 1 | 0 | OFF | ON | ON | OFF |
| 1 | 0 | 1 | 0 | ON | OFF | ON | OFF |
| REPEAT FROM THE BEGINNING | | | | | | | |

The above table shows the previously discussed sequence required to change from switch 1 on and switch 2 off to switch 2 on and switch 1 off without voltage spikes. This sequence is generated by executing microprocessor code to output bytes in quick succession to port PA bits PA4,PA5, PA6,PA7.

Assume that the last byte output corresponds to the first line in the above table, leaving switch 1 ON and switch 2 OFF. The processor then waits for the length of time for which SWITCH 1 is desired to be ON. After that time, the next two bytes are output, corresponding to lines 2 and 3 of the above table, leaving switch 2 ON and switch 1 OFF. The microprocessor then waits for the length of time Switch 2 is desired to be ON, and then outputs a further two bytes corresponding to the fourth and first line of the above table, returning to the state switch 1 ON, switch 2 Of F. This sequence then repeats until a logic change is detected at PA1 from slicer 2003, indicating that the sign of the current has changed. This causes an interrupt that branches the code such that it subsequently performs the sequence for switch change intended for negative current half cycles shown in the table below.

| Pin 14 | Pin 13 | Pin 11 | Pin 12 | 1100-1 | 1200-2 | 1100-2 | 1200-1 |
|---|---|---|---|---|---|---|---|
| 1 | 0 | 0 | 1 | ON | OFF | OFF | ON |
| 0 | 1 | 0 | 1 | OFF | ON | OFF | ON |
| 0 | 1 | 1 | 0 | OFF | ON | ON | OFF |
| 0 | 1 | 0 | 1 | OFF | ON | OFF | ON |
| REPEAT FROM THE BEGINNING | | | | | | | |

The above description with the aid of FIG. 13 is intended to be exemplary and not an exhaustively researched and tested design. In particular, depending on the switch cycling frequency desired (i.e. lower or higher than 100 KHz) it may be that the ATTINY461 microprocessor is not fast enough. In that case, a much faster processor such as an ARM, or else some digital hardware assistance would be in order. The advantage of including a microprocessor at all is that it can have a communications interface with other parts of the system, such as the solar inverter/battery system, which can control the share of load taken from the solar system in dependence on the amount of solar energy being received or on the state of charge of the battery. Other functions can be implemented using the current and voltage sensors such as detection of fault conditions such as excessive current, under voltage of one or other source, or source 1 and source 2 voltages having a relative phase error. The phase error can be measured by means of the voltage zero crossings and transmitted back to an Inverter in order to synchronize it.

Thus it has described above how a solid-state device can be constructed to share the burden of delivering current to an electrical load between two independent power sources. The principle could be extended to sharing load current between any number of sources, using a corresponding number of AC switches such as in FIG. 9 and developed further in the above description. Of course for a split-phase 120/240 volt system, it would be appropriate to use two instances of the invention, one for each volt phase. For a three-phase system, three instances of the invention would be appropriate. In the split phase and three-phase cases, multiple instances of the invention can share components such as the timing controller and be housed in a single enclosure. This permits independent control of the power sharing for each phase, as the load currents may be different for each phase. Also in mutli-phase systems, there may be one inverter per phase, a multi-phase Inverter, and such inverters may be powered from the same or different batteries or solar arrays, also making the optimum power sharing to be achieved different for each phase.

Figure 14:
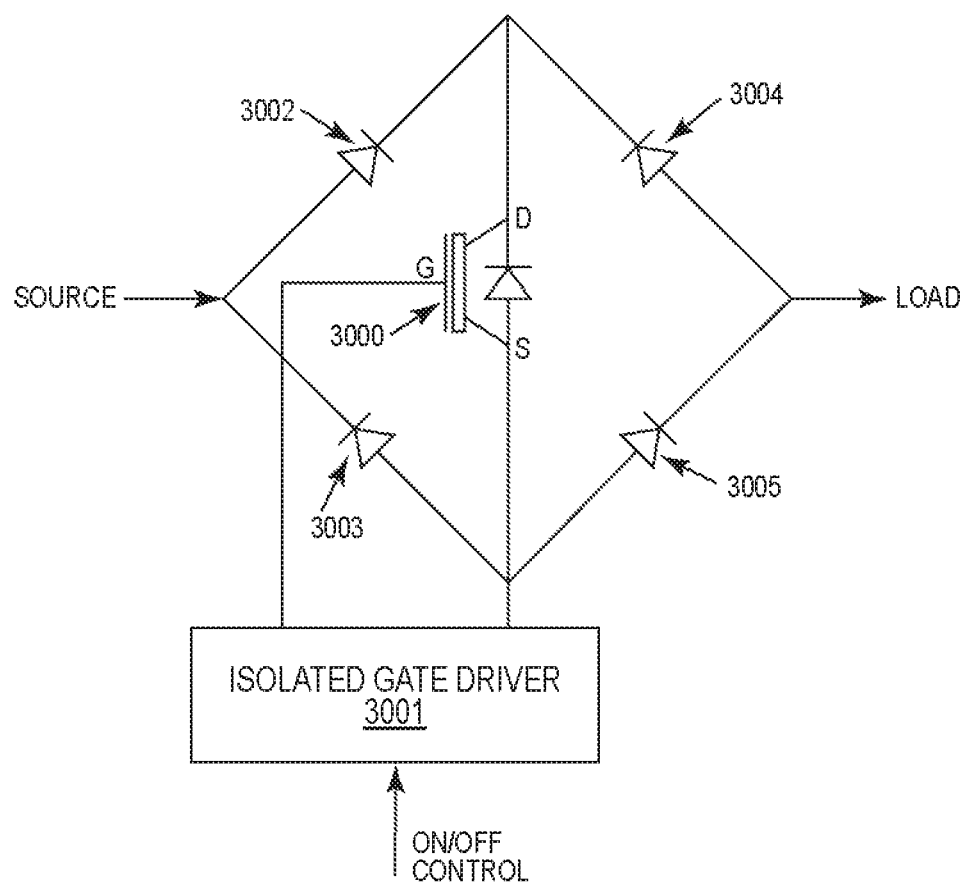
FIG. 14 shows another possible AC switch circuit

For completeness, another possible circuit for an AC switch is shown in FIG. 14. A diode bridge (3002,3003, 3004,3005) ensures that, whatever the polarity of the source, a positive voltage is applied to the drain terminal D of N-type MOSFET (3000) and a negative voltage is applied to the source terminal S. When MOSFET (3000) is OFF, no current flows in the bridge and therefore no current flows in the source. When MOSFET (3000) is ON, the bridge output is short circuited and the bridge presents a low AC impedance from the source to the load. The voltage drop of the switch of FIG. 14 is two diode drops plus the drop of MOSFET (3000). This may be larger than the voltage drop of the switch of FIG. 9, but when this drop is small compared to the operating voltage, which in some applications may be higher than volts, FIG. 14 can be a lower cost solution.

Higher voltage switches can be built by combining semiconductors in series, in either FIG. 9 or FIG. 14. Thus the invention could be extended to utility scale transmission voltages such as 13,200 volts or higher, providing a "smart grid" fine control over load sharing between two or more generating sources.

When one of the sources, say source 2, is a DC to AC Inverter, it is likely to be of a switching type that already has a low-pass filter at its output. It is not necessary to have both an inverter output filter and the low pass filter (1002) of FIG. 4. A single filter can be used, that has a cut off frequency related to the lower of the inverter switching frequency and the switching frequency used in the invention. Moreover, it may be possible to absorb switch (1010-2) of FIG. 4 into such an inverter, if the inverter is not powering anything else.

Figure 16:
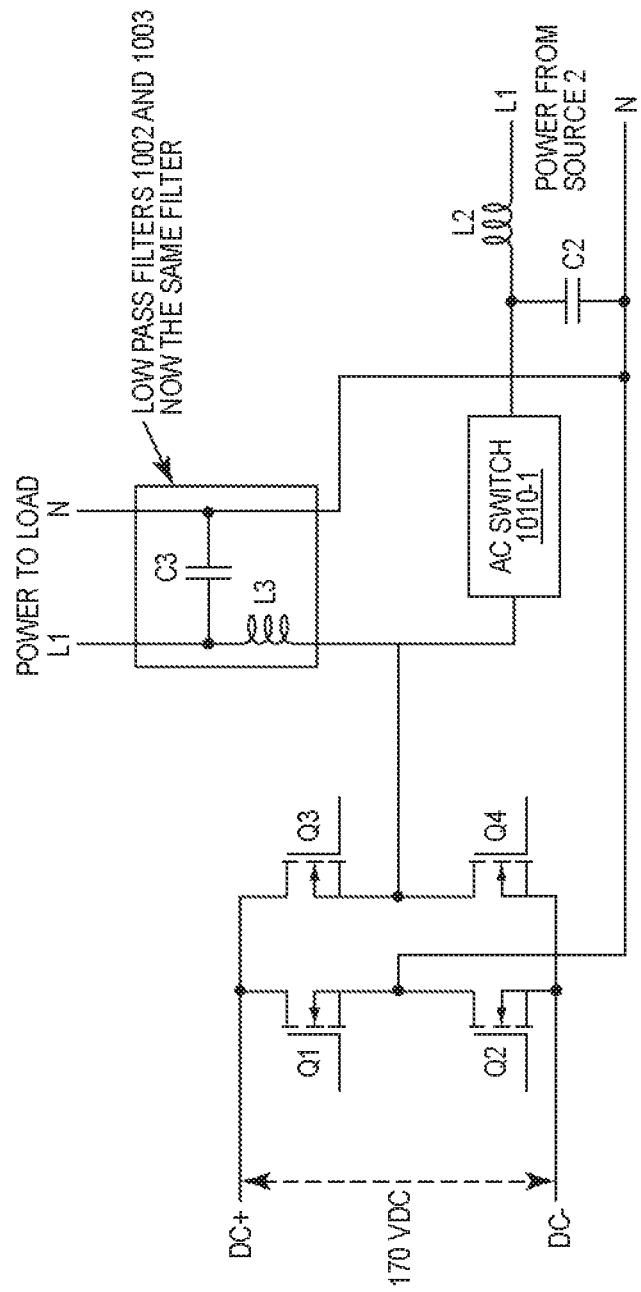
FIG. 16 shows an integration of an output low pass filter into a DC to AC inverter.

FIG. 16 shows an arrangement where one of the AC switches and low-pass filter (1001 or 1002) of FIG. 4 are absorbed into the DC to AC inverter. Filter (1001 or 1002) would have normally existed at the output of an inverter to smooth any switching steps and maintain a good sine wave approximation at the power line frequency. This filter is now combined with filter (1003), as it suffices that the inverter output pass through only one filter on the way to the load.

An inverter such as described in the herein-incorporated '822 patent may utilize a switched approximation to a sine-wave, such as delta modulation, delta-sigma modulation or pulse-width modulation. The switched approximation is produced by an H-bridge composed of transistors Q1,Q2,Q3,Q4 in FIG. 16. To obtain a sine wave at the power line frequency, Q1 is turned on with Q2 off when a negative half cycle is to be produced, connecting the positive of the 170 v DC source to neutral. The Live output is produced by switching Q3 and Q4 alternately to produce −170 v or 0 at the output to L3. The minimum time spent at either 0 or −170 v is limited to being not less than a minimum value, such as 1 uS, while controlling the proportion of time that the output is switched to −170 should equal the ratio that the instantaneous value of the desired output 120 v rms sine wave bears to the 170 volt peak. The positive half cycle is produced by turning on Q2 with Q1 off, connecting the DC −ve to neutral. Q3 and Q4 then switch +170 v DC or zero through to L3 for proportions of the time required to approximate a sine wave, with the same constraint of a minimum dwell time at one or the other level. Mathematically, the volt-time integral over the period that the 170 v DC supply is switched through to L3 should equal the volt-time integral of the desired 120 v rms AC sine wave. Such an ON-OFF sequence can be precomputed and stored in memory. A good method of precomputing the sequence is to use a multi-state Viterbi look-ahead method of generating sigma-delta modulation, as described in, for example, "Efficient trellis-type sigma-delta modulator", P Harpe, D. Reefman and E. Jannsen, Proceedings of the Audio Engineering Society Convention, 2003.

If both Q3 and Q4 are switched OFF, when there is current in L3, the voltage spike is caught either by the intrinsic diode of Q3 or that of Q4. The stored energy in L3 is actually then returned to the DC source. Therefore no separate spike catching circuit is required and there is no loss of efficiency entailed. When Q3 and Q4 are both OFF moreover, AC switch (1010-1) may be turned ON to maintain load current from source 2, e.g. from the electricity grid. If the peak voltage of the electricity grid is greater than the 170 v DC supply voltage, the intrinsic diodes of Q3 and Q4 form a full-wave rectifier feeding power backwards to the DC source. This can be used to keep a battery float charged for use in an emergency, but if this not desired, a blocking diode can be inserted in one or other DC supply lead to prevent reverse current flow. A decoupling capacitor is then required on the H-bridge side of the blocking diode to recover reverse current flow energy.

Thus using the invention in the form of FIG. 16 to share power between a first source such as a solar inverter and a second source such as the electricity grid comprises alternating between periods during which Q3 and Q4 are OFF and AC switch (1010-1) is ON, and periods during which AC switch (1010-1) is OFF and Q3 and Q4 go on and off alternately to generate an instantaneous approximation to the desired sine wave power frequency voltage. In the configuration of FIG. 16, the switching of the inverter and the switching of the AC switch therefore have to be coordinated to achieve the goals of load sharing in the desired ratio by utility and inverter respectively, maintaining a good sine wave to the load, and maintaining a sine-wave current draw from the utility, with low harmonic content and without exporting high frequency interference.

Figure 15:
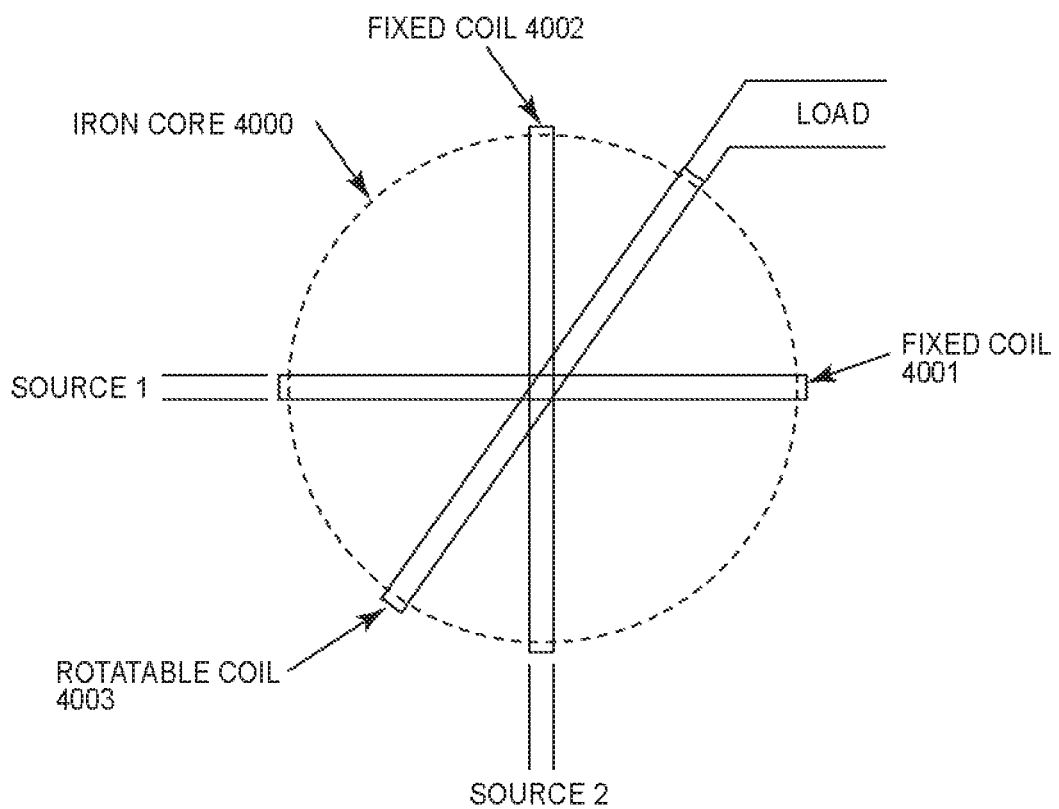
FIG. 15 shows an electromechanical method of combining power sources

For completeness it is considered whether any other coupling device other than the arrangement of semiconductor switches disclosed above could be contemplated for coupling a first power source and a second power source to a load to thereby share the load current without the sources being coupled together. FIG. 15 shows an arrangement of two fixed coils at right angles and a rotatable coil. From other fields of electronics, such an arrangement is known as a goniometer. The rotating coil 4003 can be rotated to be in the plane of fixed coil 4001, and thus strongly coupled to it and not coupled to coil 4002, or can be rotated to be in the plane of coil and not coupled to coil 4001. In between, it is coupled to both in the ratio Cosine(θ) to one and Sine(θ) to the other.

A goniometer is generally used at radio frequencies as part of a direction finding apparatus. To use a goniometer at power line frequencies, a high permeability core would be needed to increase coil inductance values. For example, a laminated iron core can be used, and the whole arrangement enclosed in a laminated iron outer pot to complete the magnetic circuit. A motor Stator/Rotor configuration could also be used. Thus an electromechanical arrangement can serve as a coupling device to couple two sources to the same load in variable proportions without coupling the sources to each other.

The voltage picked up by the rotatable coil is V3=V1 cos(θ)+V2 sin(θ), where θ is the angle between the rotating coil 4003 and fixed coil 4001, and V1 is the voltage of source 1 and V2 is the voltage of source 2. If V1 and V2 are in phase, V3 is not independent of angle because the weighting factors do not add to unity, as did the weighting factors "a" and "b" in the foregoing arrangements. In order for the output voltage to remain between V1 and V2 as the rotating coil is moved, V1 and V2 can be deliberately maintained 90 degrees out of phase. Then the magnitude of V3 is given by $$\sqrt{(V1\ \cos(\theta))^2 + (V2\ \sin(\theta))^2}$$

which is constant when V1=V2 because (V1 cos(θ))²+ (V2 sin(θ))²=1, and varies between V1 and V2 as θ is rotated otherwise.

When the two source voltages are 90 degrees out of phase, a rotating magnetic field is produced that will attempt to rotate the iron core if eddy currents are induced. If the iron core is left free to rotate, it will rotate at the power line frequency (3000 RPM for 60 Hz) and no eddy current losses will then be incurred.

There is also a strong torque applied to the rotatable coil proportional to the load current. This requires that the rotating coil be firmly anchored when it is placed at the desired angle.

The arrangement of FIG. 15 maintains strict isolation between the sources, the current from source 1 being equal to the load current times cos(θ) and independent of V2 while the current from source 2 is the load current times sin(θ) and independent of V1. The device of FIG. 15 is not however necessarily more efficient than the switching method described heretofore, and may be much larger and more expensive for the same power rating. This is likely also to be the case if an attempt were made to realize FIG. 6 using switched-tap transformers, however, it might be a competitive realization for very high power utility applications.

Thus a useful method and apparatus has been described for sharing the burden of providing an electrical current to a load. The method can be adapted to work for DC power sources as well as AC power sources. A person skilled in the art may make many adaptations of the circuits disclosed without departing from the spirit of the invention which is captured in the attached claims.

I claim:

1. An apparatus operative to adaptively share an electrical load between two independent, Alternating Current (AC) electrical power sources, comprising:
    a variable coupling device to couple a first AC electrical power source to said load to supply a first proportion of the load current, and to couple a second AC electrical power source to the same said load to supply a second proportion of said load current, the coupling device maintaining isolation between the first and second power sources such that no power is transferred from the first power source to the second power source or vice versa;

wherein said first and second AC electrical power sources are approximately synchronized in voltage and phase.

2. The apparatus of claim 1 wherein said variable device further comprises:
a first low pass filter operative to connect said first electrical power source to a first input of a selection switch;
a second low pass filter operative to connect said second electrical power source to a second input of said selection switch;
output terminals operative to connect to said load, the output terminals being connected to the output of said selection switch through a third low-pass filter; and
a switch controller operative to cause said selection switch to select said first and second AC electrical power source alternately at a high rate with respect to the cut-off frequency of said first, second and third low pass filters, wherein the proportion of time an AC electrical power source is selected determines the proportion of the load current supplied by that AC electrical power source.

3. The apparatus of claim 1 configured for said first and second AC electrical power sources to be an electrical utility grid supply and a DC to AC inverter, respectively.

4. The apparatus of claim 1 wherein the electrical power sources are AC power sources, and wherein the variable coupling device comprises a goniometer, comprising:
a first fixed coil of wire connected to the first electrical power source;
a second fixed coil of wire oriented at 90° with respect to the first coil and connected to the second electrical power source; and
a third coil of wire operative to rotate between the plane of the first fixed coil and the plane of the second fixed coil and connected to the electrical load;
whereby the third coil is proportionally, variably, inductively coupled to either or both the first and second fixed coils in dependence on its angular orientation between the respective planes of the two fixed coils.

5. The apparatus of claim 1 wherein one electrical power source is a switched DC to AC inverter and wherein said variable coupling device is integrated with the inverter and comprises:
an electrically controlled semiconductor AC switch operative to selectively output current from said first power source to the load;
a first low pass filter interposed between said first electrical power source and said electrically controlled semiconductor AC switch;
a second low pass filter interposed between an output of said electrically controlled semiconductor AC switch and the load;
an H-bridge of four transistors connected between the DC inputs of the inverter, two transistors being connected to the common neutral and two transistors being connected to a hot input of the second low pass filter, the H-bridge transistors being operative to
produce a positive AC cycle by connecting the negative DC input to a common neutral line and alternately connecting the positive and negative DC inputs to a hot output line for varying durations to approximate a sine wave, and
produce a negative AC cycle by connecting the positive DC input to the common neutral line and alternately connecting the positive and negative DC inputs to the hot output line for varying durations to approximate the sine wave; and
a switch controller operative to control both said H-bridge of transistors and said electrically controlled semiconductor AC switch to alternately output current to said second low pass filter by switching between the two at a high rate with respect to the cut-off frequency of said first and second low pass filters, wherein the proportion of time a source is selected determines the proportion of the load current supplied by that source.

6. An apparatus operative to adaptively share an electrical load between two independent, alternating current electrical power sources, comprising:
a first low pass filter operative to connect said first electrical power source through a first electrically controlled semiconductor AC switch to the input of a third low pass filter;
a second low pass filter operative to connect said second electrical power source through a second electrically controlled semiconductor AC switch to the same input of said third low pass filter;
output terminals operative to connect to said load, the output terminals being connected to the output of said third low-pass filter; and
a switch controller operative to control said first and second AC switches to pass current from said first and second power source alternately at a high rate with respect to the cut-off frequency of said first, second and third low pass filters, wherein the proportion of time a source is selected determines the proportion of the load current supplied by that source.

7. The apparatus of claim 6 wherein said first and second semiconductor AC switches each comprise:
an input terminal connected to the drain of a first MOSFET;
an output terminal connected to the drain of a second MOSFET; and
a floating DC voltage source operative to provide a gate drive potential for said first and second MOSFETs, one polarity output of said floating voltage source being connected to the source terminals of both said first and second MOSFET and the opposite polarity of said floating voltage source being connected to the power supply input for a gate driver circuit, the gate driver circuit supplying gate drive outputs to the gate terminals of said first and second MOSFETs and providing electrically isolated control inputs for receiving control signals from said switching controller.

8. The apparatus of claim 6 wherein said first and second semiconductor AC switches each comprise:
an input terminal connected to the drain of a first MOSFET having an intrinsic drain-source diode;
an output terminal connected to the drain of a second MOSFET having an intrinsic drain-source diode; and
a floating DC voltage source to provide a gate drive potential for said first and second MOSFETs, one polarity output of said floating voltage source being connected to the source terminals of both said first and second MOSFETs and the opposite polarity of said floating voltage source being connected to the power supply input for a gate driver circuit, the gate driver circuit supplying gate drive outputs to the gate terminals of said first and second MOSFETs and providing electrically isolated control inputs for receiving control signals from said switching controller, wherein said switching controller controls said gate drivers of the first and second MOSFETs of each of said first and second AC switches to turn ON and OFF in such a sequence that at no time are both MOSFETs of both switches ON at the same time and such that the current flowing between the output terminal of the first or second switch and said third low pass filter always has a path through one or other of said MOSFETs or said intrinsic drain-source diodes.

9. The apparatus of claim 6 wherein said first and second semiconductor AC switches each comprise:
   a diode bridge circuit having
      a positive node at the junction of two cathodes,
      a negative node at the junction of two anodes,
      a first node at one junction of an anode and cathode, and
      a second node at the other junction of an anode and cathode;
   a gate driver circuit outputting a gate drive signal operative to turn a MOSFET ON and OFF in response to control signals from said switching controller; and
   a MOSFET having drain, source, and gate terminals, wherein
      the drain of the MOSFET is connected to the positive node of the diode bridge circuit, and
      the source of the MOSFET is connected to the negative node of the diode bridge circuit and a ground terminal of the gate driver circuit, and
      the gate of the MOSFET is connected to the gate drive signal;
   wherein when the gate drive signal turns the MOSFET OFF, no current flows between the first and second nodes, and when the gate drive signal turns the MOSFET ON, current flows between the first and second nodes through two diodes and the MOSFET channel.

10. A method of adaptively sharing an electrical load between two independent, Alternating Current (AC) electrical power sources approximately synchronized in voltage and phase, comprising:
   determining a first fraction of the load current to be provided by a first of said two independent AC electrical power sources;
   determining the remaining fraction of the load current to be provided by the second of said two independent AC electrical power sources
   connecting the output of said first AC electrical power source to said load for a first duration to provide said first fraction of the desired load current;
   connecting the output of said second AC electrical power source to said load for a second duration to provide said second fraction of the desired load current; and
   whereby said first and second fractions of said desired load current add to produce said desired load current.

11. The method of claim 10 wherein said determined first fraction of the load current is provided by a solar energy source, and the corresponding first fraction of the power is controlled to match either the average or the instantaneous solar energy received.

12. The method of claim 10 wherein connecting the output of said first AC electrical power source comprises controlling a first switch to select the output of said first AC electrical power source to be connected for said first duration to said electrical load through a low pass filter and connecting the output of said second AC electrical power source comprises controlling a second switch to select the output of said second AC electrical power source to be connected for said second duration to said electrical load through said low pass filter, said first and second switches never selecting to connect respective sources through said low pass filter to said load at the same time.

13. The method of claim 10 wherein connecting the output of said first and second AC electrical power sources comprises controlling a first switch and a second switch alternately to select the output of said first AC electrical power source to be connected for said first duration to said electrical load through a low pass filter and to select the voltage output of said second AC electrical power source to be connected for said second duration to said electrical load through said low pass filter, the alternate selection occurring at such a frequency that said low pass filter substantially prevents any unwanted voltage ripple related to said frequency from appearing at the load.

14. The method of claim 13 further comprising low pass filters interposed between said first power source and said first switch and between said second power source and said second switch such that said first and second power sources experience a mean current load substantially free from ripple at said alternating switch selection frequency.

* * * * *